United States Patent
Park et al.

(10) Patent No.: US 11,024,697 B2
(45) Date of Patent: Jun. 1, 2021

(54) DISPLAY APPARATUS AND METHOD OF MANUFACTURING THE SAME

(71) Applicant: SAMSUNG DISPLAY CO., LTD., Yongin-si (KR)

(72) Inventors: Junhyun Park, Suwon-si (KR); Dongwoo Kim, Yongin-si (KR); Sungjae Moon, Seongnam-si (KR); Kangmoon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/717,171

(22) Filed: Dec. 17, 2019

(65) Prior Publication Data

US 2020/0219960 A1   Jul. 9, 2020

(30) Foreign Application Priority Data

Jan. 3, 2019   (KR) .................. 10-2019-0000572

(51) Int. Cl.
*H01L 27/32* (2006.01)
*H01L 51/52* (2006.01)

(52) U.S. Cl.
CPC ...... *H01L 27/3276* (2013.01); *H01L 27/3258* (2013.01); *H01L 27/3262* (2013.01); *H01L 51/5237* (2013.01)

(58) Field of Classification Search
CPC ............. H01L 27/3276; H01L 27/3258; H01L 27/3262; H01L 51/5237; H01L 27/3279; H01L 27/3248; H01L 27/1244; G09G 2320/0223; G09G 2300/0404; G09G 2310/0286; G09G 2300/0426; G09G 2330/04; G09G 3/20
See application file for complete search history.

(56) References Cited

U.S. PATENT DOCUMENTS

| | | | | |
|---|---|---|---|---|
| 6,433,767 | B1 * | 8/2002 | Murade | G02F 1/13454 345/92 |
| 10,720,090 | B2 * | 7/2020 | Lee | G09G 3/3677 |
| 10,878,764 | B2 * | 12/2020 | Kim | G09G 3/3648 |
| 2014/0327008 | A1 * | 11/2014 | Azami | G02F 1/1333 257/72 |
| 2015/0187279 | A1 * | 7/2015 | Lee | H01L 51/56 257/40 |
| 2015/0255171 | A1 * | 9/2015 | Nishi | G11C 19/28 377/54 |

(Continued)

FOREIGN PATENT DOCUMENTS

KR   10-2018-0036855   4/2018

*Primary Examiner* — Victor A Mandala
(74) *Attorney, Agent, or Firm* — F. Chau & Associates, LLC

(57) ABSTRACT

A display apparatus includes a base substrate that includes a display area in which pixels are formed and a peripheral area that is a non-display area that surrounds the display area, a first conductive pattern layer disposed on the base substrate, a first insulating layer disposed on the first conductive pattern layer, a second conductive pattern layer disposed on the first insulating layer, a second insulating layer disposed on the second conductive pattern layer, and a third conductive pattern layer disposed on the second insulating layer. The peripheral area includes a first wiring area and a circuit area.

16 Claims, 16 Drawing Sheets

(56) References Cited

U.S. PATENT DOCUMENTS

| | | | |
|---|---|---|---|
| 2016/0041442 A1* | 2/2016 | Chen | G02F 1/1345 |
| | | | 257/72 |
| 2017/0124972 A1* | 5/2017 | Kim | G09G 3/3677 |
| 2018/0166037 A1* | 6/2018 | Lee | G09F 9/30 |
| 2019/0073069 A1* | 3/2019 | Yeh | G06F 3/0412 |
| 2019/0197937 A1* | 6/2019 | Lee | G09G 3/20 |

* cited by examiner

DISPLAY APPARATUS AND METHOD OF MANUFACTURING THE SAME

This application claims priority under 35 U.S.C. § 119 from, and the benefit of, Korean Patent Application No. 10-2019-0000572, filed on Jan. 3, 2019 in the Korean Intellectual Property Office, the contents of which are herein incorporated by reference in their entirety.

BACKGROUND

1. Technical Field

Exemplary embodiments of the inventive concept are directed to a display apparatus. More particularly, exemplary embodiments of the inventive concept are directed to a display apparatus with improved display quality.

2. Discussion of the Related Art

Recently, a light weight and small display apparatus has been manufactured. A cathode ray tube (CRT) display apparatus has been used in the past due to its performance and competitive price. However, a CRT display apparatus is large and lacks portability. Therefore display apparatuses such as a plasma display apparatus, a liquid crystal display apparatus or an organic light emitting display apparatus have become favored due to their small size, light weight and low-power-consumption.

A display apparatus includes a display area and a peripheral area that is a non-display area that surrounds the display area. Various circuits and wirings that drive the display apparatus are disposed in the peripheral area. Various efforts have been made to reduce the size of the peripheral area.

SUMMARY

One or more exemplary embodiment of the inventive concept provides a display apparatus with a reduced peripheral area and improved display quality by reducing resistance of signal lines and parasitic capacitance.

According to an exemplary embodiment of the inventive concept, a display apparatus includes a base substrate that includes a display area in which pixels are formed and a peripheral area that is a non-display area that surrounds the display area, where the peripheral area includes a first wiring area and a circuit area, a first conductive pattern layer disposed on the base substrate, a first insulating layer disposed on the first conductive pattern layer, a second conductive pattern layer disposed on the first insulating layer, a second insulating layer disposed on the second conductive pattern layer, and a third conductive pattern layer disposed on the second insulating layer. A plurality of signal lines are disposed in the first wiring area and are spaced apart in a first direction and extend in a second direction substantially perpendicular to the first direction. A gate signal generator is disposed in the circuit area and generates a gate signal and transmits the gate signal to the pixels. A plurality of connecting lines are disposed in the peripheral area and extend in the first direction and respectively connect the signal lines to the gate signal generator. The connecting lines are formed of a lowermost layer or an uppermost layer of the conductive pattern layers. The signal lines are formed of at least two layers of the conductive pattern layers that overlap each other.

In an exemplary embodiment, the display apparatus may further include a thin film transistor disposed in the display area. The thin film transistor may include a lower conductive pattern disposed on the base substrate, an active pattern that overlaps the lower conductive pattern, a gate electrode disposed on the active pattern, and source and drain electrodes electrically connected to the active pattern. The lower conductive pattern and the connecting lines may be formed of the first conductive pattern layer. The gate electrode may be formed of the second conductive pattern layer. The source and drain electrodes may be formed of the third conductive pattern layer. Each of the signal lines may be formed of the second conductive pattern layer and the third conductive pattern layer.

In an exemplary embodiment, the display apparatus may further include a lower conductive pattern disposed in the display area of the base substrate, and a thin film transistor disposed in the display area and that overlaps the lower conductive pattern. The thin film transistor may include an active pattern that overlaps the lower conductive pattern, a gate electrode disposed on the active pattern, and source and drain electrodes electrically connected to the active pattern. The lower conductive pattern may be formed of the first conductive pattern layer. The gate electrode may be formed of the second conductive pattern layer. The source and drain electrodes and the connecting lines may be formed of the third conductive pattern layer. Each of the signal lines may be formed of the first and second conductive pattern layers.

In an exemplary embodiment, the display apparatus may further include a third insulating layer disposed on the third conductive pattern layer, and a fourth conductive pattern layer disposed on the third insulating layer.

In an exemplary embodiment, the signal lines may be formed of the first, second and third conductive pattern layers. The connecting lines may be formed of the fourth conductive pattern layer.

In an exemplary embodiment, the signal lines may be formed of the second, third and fourth conductive layers. The connecting lines may be formed of the first conductive pattern layer.

In an exemplary embodiment, the display apparatus may further include an insulating pattern having the same planar shape as the second conductive pattern layer disposed between the first insulating layer and the second conductive pattern layer. A portion of the third conductive pattern layer may be electrically connected to a portion of the first conductive pattern layer through a contact hole that penetrates the second and first insulating layers. A portion of the fourth conductive pattern layer may be electrically connected to a portion of the third conductive pattern layer through a contact hole that penetrates the third insulating layer.

In an exemplary embodiment, the signal lines may be formed of the first and second conductive pattern layers. The connecting lines may include two layers which are formed of the third and fourth conductive pattern layers and that overlap each other.

In an exemplary embodiment, the signal lines may be formed of the third and fourth conductive pattern layers. The connecting lines may include two layers which are formed of the first and second conductive patient layers and that overlap each other.

In an exemplary embodiment, the display apparatus may further include an insulating pattern having the same planar shape as the second conductive pattern layer disposed between the first insulating layer and the second conductive pattern layer. A portion of the third conductive pattern layer may be electrically connected to a portion of the first conductive pattern layer through a contact hole that penetrates the second and first insulating layers.

In an exemplary embodiment, the peripheral area may further include a second wiring area disposed between the circuit area and the display area. The display apparatus may further include a plurality of power supply lines disposed in the second wiring area and that are spaced apart in the first direction and that extend in the first direction, and a plurality of power supply connecting lines disposed in the peripheral area that connect the power supply lines to the gate signal generator and extend in the first direction. The power supply connecting lines may be formed of the lowermost layer or the uppermost layer of the conductive pattern layers. The power supply lines may be formed of at least two or more layers of the conductive pattern layers.

In an exemplary embodiment, the display apparatus may further a third insulation layer disposed on the third conductive pattern layer, and a fourth conductive pattern layer disposed on the third insulation layer. The power supply connecting line may be formed of the first conductive pattern layer or the fourth conductive pattern layer, and each of the power supply lines may be formed of the second to fourth conductive pattern layers or the first to third conductive pattern layers.

In an exemplary embodiment, the display apparatus may further include a via insulating layer disposed on the second insulating layer, a first electrode disposed on the via insulating layer in the display area, a light emitting layer disposed on the first electrode, a second electrode disposed on the light emitting layer, and an ELVSS line in the second wiring area that overlaps at least two of the power supply lines. The ELVSS line may be electrically connected to the second electrode.

In an exemplary embodiment, the display apparatus may further include a shield wiring disposed on the base substrate adjacent to the signal lines. The shield wiring may be formed of one or more of the first to third conductive pattern layers, and the signal lines are disposed between the shield wiring and the gate signal generator.

In an exemplary embodiment, the display apparatus may further include a gate connecting line that connects the gate signal generator and the pixel. The gate connecting line may be formed of a lowermost layer or an uppermost layer of the conductive pattern layers.

In an exemplary embodiment, the signal lines may include a first portion and a second portion that overlaps the first portion. The first portion and the second portion may be connected through a contact hole that penetrates an insulation layer between the first portion and the second portion.

According to an exemplary embodiment of the inventive concept, a display apparatus includes a base substrate that includes a display area in which pixels are formed and a peripheral area that is a non-display area that surrounds the display area, where the peripheral area includes a first wiring area and a circuit area, an active pattern disposed on the base substrate, a gate insulating layer disposed on the active pattern, a gate conductive pattern layer disposed on the gate insulating layer, an interlayer insulating layer disposed on the gate conductive pattern layer, a data conductive pattern layer disposed on the interlayer insulating layer, a plurality of signal lines disposed in the first wiring area, spaced apart in a first direction and that extend in a second direction substantially perpendicular to the first direction, a gate signal generator disposed in the circuit area and that transmits a gate signal to the pixels, and a plurality of connecting lines disposed in the peripheral area and that connect the signal lines to the gate signal generator and that extend in the first direction. The connecting lines are formed of the active pattern. The signal lines are formed of the gate conductive pattern and the data conductive pattern that overlap each other.

In an exemplary embodiment, the connecting lines do not overlap the gate conductive pattern layer.

In an exemplary embodiment, the connecting lines may be a portion of the active pattern doped with impurities.

According to an exemplary embodiment of the inventive concept, a display apparatus includes a base substrate that includes a display area in which pixels are formed and a peripheral area that is a non-display area that surrounds the display area, where the peripheral area includes a first wiring area and a circuit area; a first conductive pattern layer disposed on the base substrate; a first insulating layer disposed on the first conductive pattern layer; a second conductive pattern layer disposed on the first insulating layer; a second insulating layer disposed on the second conductive pattern layer; a third conductive pattern layer disposed on the second insulating layer, a third insulating layer disposed on the third conductive pattern layer; a fourth conductive pattern layer disposed on the third insulating layer; a plurality of signal lines disposed in the first wiring area and that are spaced apart in a first direction and that extend in a second direction substantially perpendicular to the first direction; and a plurality of connecting lines disposed in the peripheral area and that extend in the first direction and are respectively connected to the signal lines. The connecting lines are formed of a lowermost layer or an uppermost layer of the conductive pattern layers, and the signal lines are formed of at least two layers of conductive pattern layers other than the conductive pattern layers of the connecting lines.

According to the exemplary embodiments of the present inventive concept, clock signal lines are formed of a plurality of conductive pattern layers, and the connecting lines that connect the clock signal lines and a gate signal generator are formed as the uppermost layer or the lowermost layer of the conductive pattern layers. The resistance of the clock signal lines is reduced and parasitic capacitance between the clock signal lines and the connecting lines can be minimized.

DETAILED DESCRIPTION

Hereinafter, exemplary embodiments of the inventive concept will be explained in detail with reference to the accompanying drawings.

Figure 1:
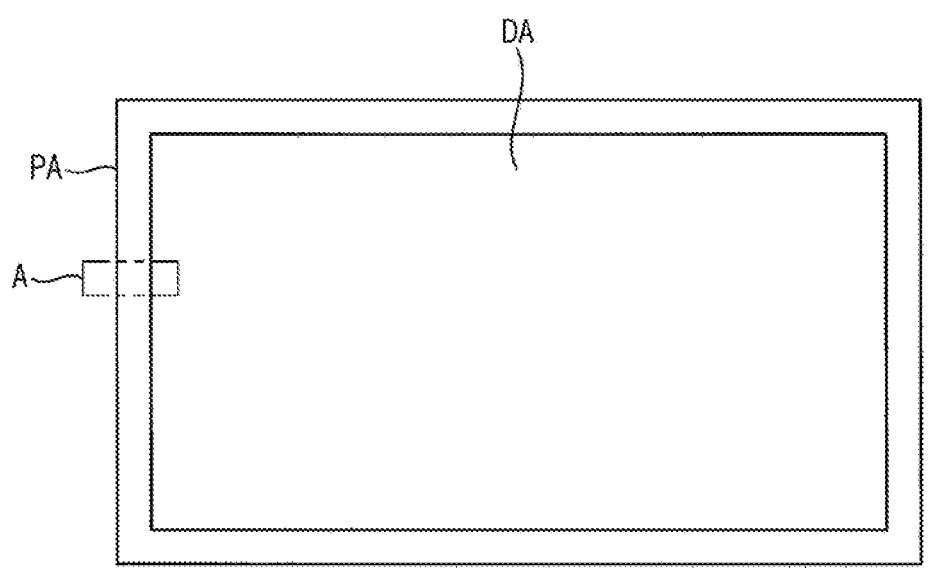
FIG. 1 is a plan view of a display apparatus according to an exemplary embodiment of the inventive concept.

FIG. 1 is a plan view of a display apparatus according to an exemplary embodiment of the inventive concept.

Referring to FIG. 1, a display apparatus according to an embodiment includes a display area DA in which an image is displayed and a peripheral area PA that is a non-display area that surrounds the display area DA.

In the display area DA, according to an embodiment, the display apparatus includes a plurality of gate lines, a plurality of data lines, and a plurality of pixels electrically connected to the gate lines and the data lines, respectively. The gate lines extend in a first direction D1 and the data lines extend in a second direction D2 that crosses the first direction D1.

According to an embodiment, each pixel includes a switching element, a liquid crystal capacitor electrically connected to the switching element, and a storage capacitor. The pixels are arranged in a matrix.

According to an embodiment, in the peripheral area PA, driving circuits are disposed that generate signals that drive the pixels. For example, a gate driver that generates a gate driving signal such as a clock signal and a gate signal generator (ASG in FIG. 2) that generates a gate signal using the gate driving signal are disposed in the peripheral area PA.

Figure 2:
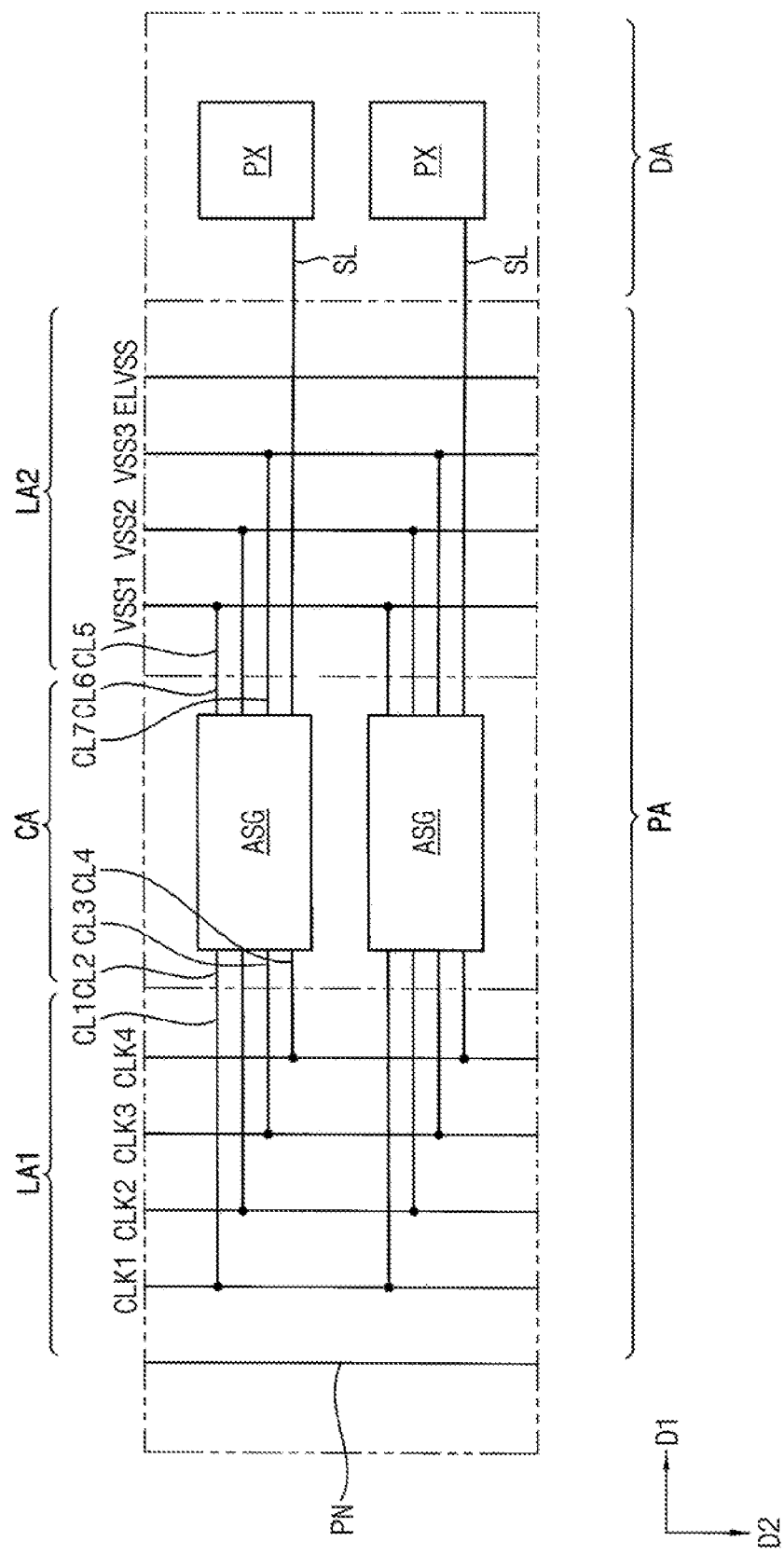
FIG. 2 illustrates circuits and wirings in an area A of a display apparatus of FIG. 1.

FIG. 2 illustrates circuits and wirings in an area A of a display apparatus of FIG. 1.

Referring to FIGS. 1 and 2, according to an embodiment, the peripheral area PA of the display apparatus includes a first wiring area LA1, a circuit area CA, and a second wiring area LA2. The circuit area CA is disposed between the first wiring area LA1 and the second wiring area LA2. The second wiring area LA2 is disposed between the circuit area CA and the display area DA. In the drawing, a line PN indicates an end of a base substrate of the display apparatus.

According to an embodiment, a plurality of gate driving signal lines, such as a clock signal line, are disposed in the first wiring area LA1. That is, a first clock signal line CLK1, a second clock signal line CLK2, a third clock signal line CLK3, and a fourth clock signal line CLK4 are disposed in the first wiring area LA1.

According to an embodiment, the first clock signal line CLK1, the second clock signal line CLK2, the third clock signal line CLK3 and the fourth clock signal line CLK4 extend in the second direction D2, respectively, and are spaced apart in the first direction D1.

According to an embodiment, a plurality of power supply lines are disposed in the second wiring area LA2. The power supply lines include a first power supply line VSS1, a second power supply line VSS2, and a third power supply line VSS3. First to third power sources are applied to the first to third power source lines VSS1 to VSS3, respectively, and the first to third power sources have different voltage levels. In addition, an ELVSS line is further disposed in the second wiring area LA2, and the ELVSS line is electrically connected to a second electrode (183 in FIG. 17) which will be described below, and is spaced apart from the first to third power source lines VSS1 to VSS3. However, embodiments are not limited thereto, and in other embodiments, the ELVSS line may be disposed to overlap the first to third power supply lines VSS1 to VSS3, as shown in FIG. 18.

According to an embodiment, the first to fourth clock signal lines CLK1 to CLK4 are respectively connected to the gate signal generator ASG by first to fourth connecting lines CL to CL4. Each of the first to fourth connecting lines CL to CL4 extends in the first direction D1 and the first to fourth connecting lines CL to CL4 are spaced apart along the second direction D2. The first connecting line CL1 is electrically connected to the first clock signal line CLK1. The second connecting line CL2 is electrically connected to the second clock signal line CLK2. The third connecting line CL3 is electrically connected to the third clock signal line CLK3. The fourth connecting line CL4 is electrically connected to the fourth clock signal line CLK4.

According to an embodiment, the first to third power supply lines VSS1 to VSS3 are respectively connected to the gate signal generator ASG by first to third power supply connecting lines CL5 to CL7. Each of the first to third power supply connecting lines CL5 to CL7 extends in the first direction D1 and the first to third power supply connecting lines CL5 to CL7 are spaced apart in the second direction D2. The first power supply connecting line CL5 is electrically connected to the first power supply line VSS1. The second power supply connecting line CL6 is electrically connected to the second power supply VSS2. The third power supply connecting line CL7 is electrically connected to the third power supply line VSS3.

According to an embodiment, a plurality of gate signal generators ASG are disposed in the circuit area CA. The gate signal generator ASG receives a clock signal from the first to fourth clock signal lines CLK1 to CLK4 and first to third power sources from the first to third power lines VSS1 to VSS3, and generates a gate signal.

In addition, according to an embodiment, a plurality of pixels PX are disposed in the display area DA and a gate signal is transmitted to each pixel PX through a gate connecting line SL. The gate connecting line SL electrically connects the gate line in the display area DA to the gate signal generator ASG. In addition, when the layer of the gate line differs from the layer of gate connecting line SL, they have a structure in which the gate line and the gate connecting line SL area connected to each other through a contact hole that penetrates an insulating layer.

In this embodiment, four clock signal (CLK) lines and three power source voltage (VSS) lines are shown. However, embodiments of the present inventive concept are not limited thereto. In other embodiments, the number and configuration of the clock signal lines and the power supply voltage lines may vary according to a driving method of the display apparatus.

Figure 3:
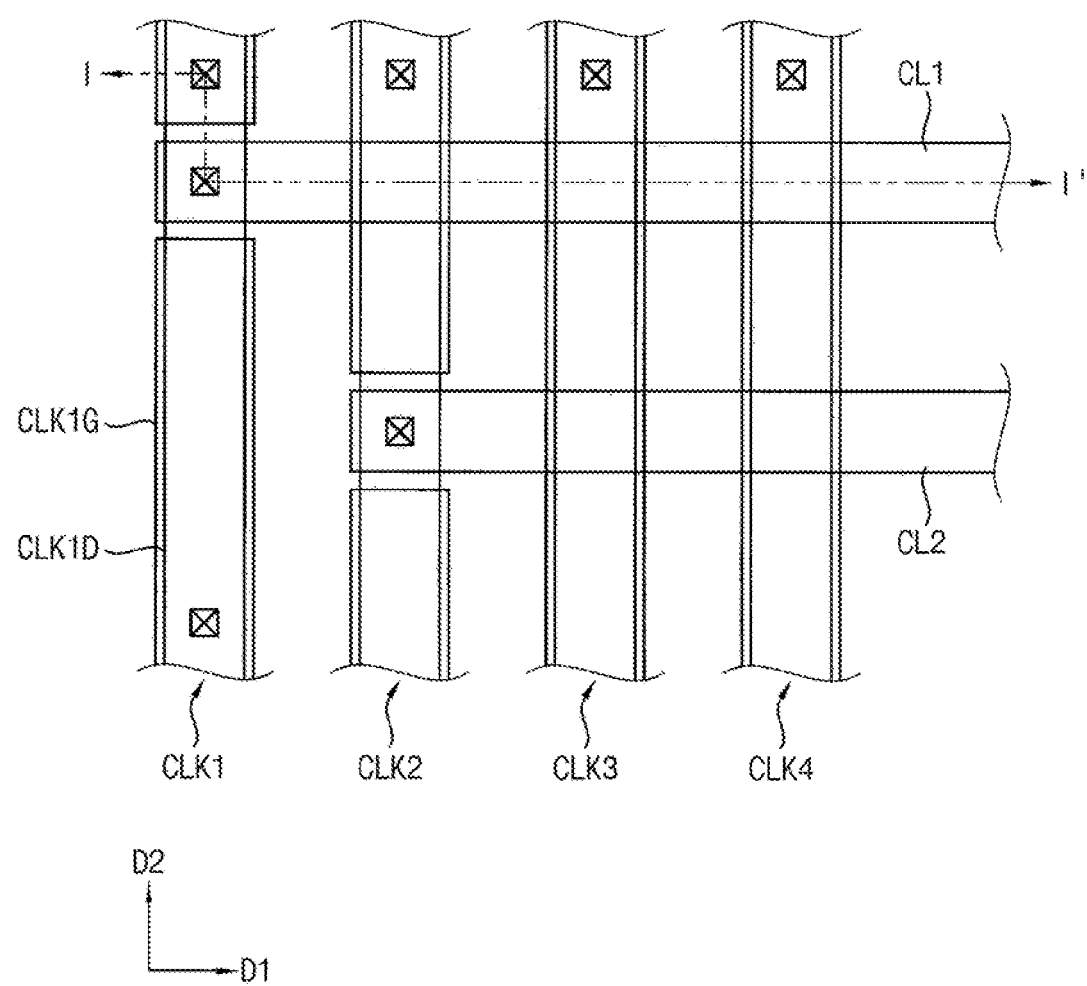
FIG. 3 is a detailed plan view of a portion of a first wiring area LA1 of FIG. 2.
Figure 4:
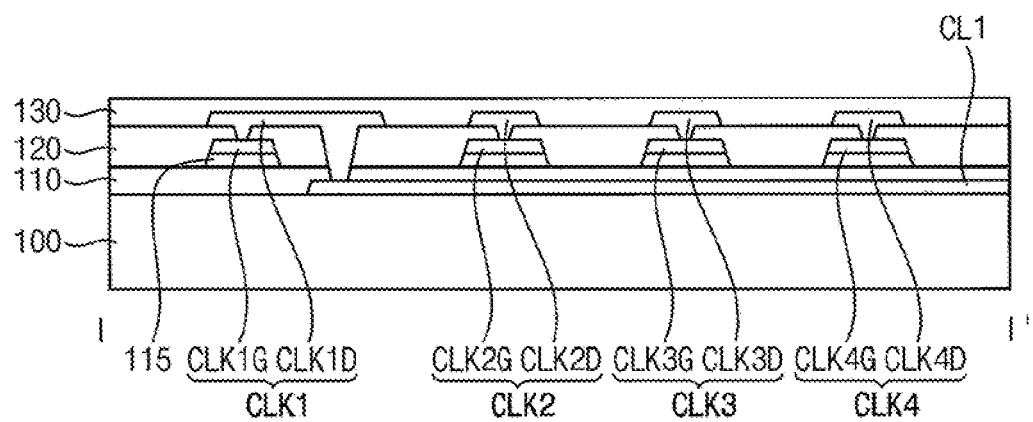
FIG. 4 is a cross-sectional view taken along a line I-I' of FIG. 3.

FIG. 3 is a detailed plan view showing a portion of a first wiring area LA1 of FIG. 2. FIG. 4 is a cross-sectional view taken along a line I-I' of FIG. 3.

Referring to FIGS. 1 to 4, according to an embodiment, a display apparatus includes a base substrate 100, a first conductive pattern layer, a first insulating layer 110, a second conductive pattern layer, an insulating pattern 115, a second insulating layer 120, a third conductive pattern layer, and a third insulating layer 130.

According to an embodiment, the base substrate 100 may include transparent or opaque insulation materials. For example, the base substrate 100 may be a quartz substrate, a synthetic quartz substrate, a calcium fluoride substrate, a fluoride-doped quartz substrate, a sodalime glass substrate, a non-alkali glass substrate, etc. Alternatively, in other embodiments, the base substrate 100 includes a flexible transparent material such as a flexible transparent resin substrate, such as a polyimide substrate.

According to an embodiment, the first conductive pattern layer is disposed on the base substrate 100. The first conductive pattern layer includes the first connecting line CL1. In addition, the first conductive pattern layer further includes a lower conductive pattern, BML in FIG. 17, in the display area DA.

According to an embodiment, the first insulating layer 110 is disposed on the base substrate 100 on which the first conductive pattern layer is disposed. The first insulating layer 110 is a buffer layer and can prevent metal atoms or impurities from diffusing from the base substrate 100 into an active pattern, ACT of FIG. 17. In addition, the first insulating layer 110 controls a rate of heat transfer in a crystallization process that forms the active pattern, thereby obtaining a substantially uniform active pattern. In addition, the first insulating layer 110 can improve the flatness of a surface of the base substrate 100 when the surface of the base substrate 100 is not uniform.

According to an embodiment, the second conductive pattern layer is disposed on the first insulating layer 110. The second conductive pattern layer includes a first layer CLK1G of the first clock signal line CLK1, a first layer CLK2G of the second clock signal line CLK2, a first layer CLK3G of the third clock signal line CLK3, and a first layer CLK4G of the fourth clock signal line CLK4.

Figure 17:
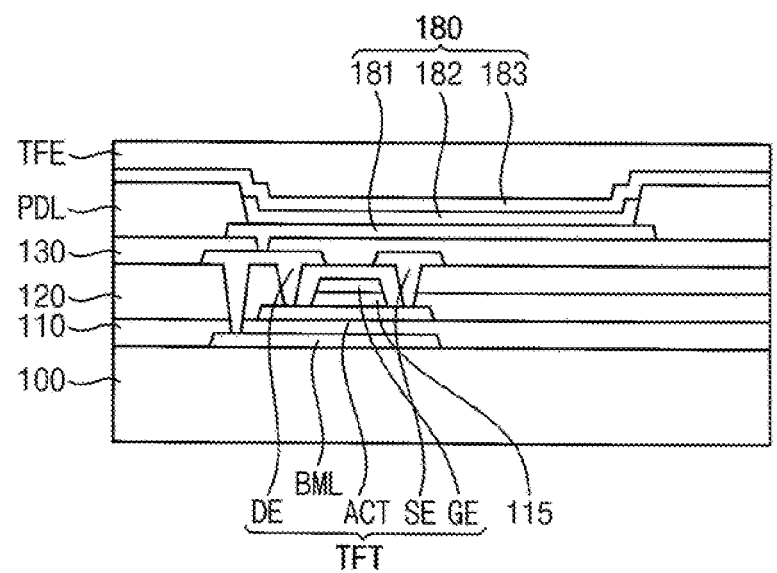
FIG. 17 is a cross-sectional view of a stacked pixel structure in a display area of a display apparatus according to an exemplary embodiment of the inventive concept.
Figure 18:
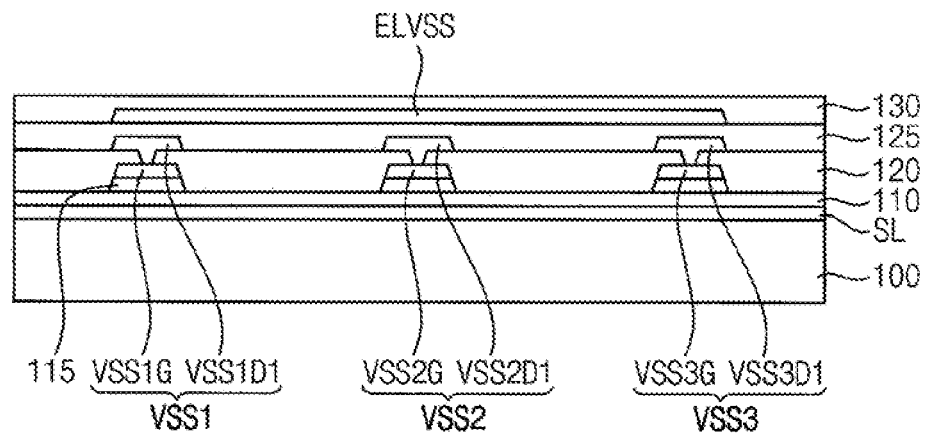
FIG. 18 is a cross-sectional view of a portion of a second wiring area LA2 of a display apparatus according to an exemplary embodiment of the inventive concept.

In addition, according to an embodiment, the second conductive pattern layer further includes a gate electrode, GE in FIG. 17, of a thin film transistor in the display area DA.

According to an embodiment, the insulating pattern 115 is disposed between the second conductive pattern layer and the first insulating layer 110 and has a same planar shape as the second conductive pattern layer.

According to an embodiment, the second insulating layer 120 is disposed on the first insulating layer 110 on which the second conductive pattern layer is disposed.

According to an embodiment, the third conductive pattern layer is disposed on the second insulating layer 120. The third conductive pattern layer includes a second layer CLK1D of the first clock signal line CLK1, a second layer CLK2D of the second clock signal line CLK2, a second layer CLK3D of the third clock signal line CLK3, and a second layer CLK4D of the fourth clock signal line CLK4.

In addition, according to an embodiment, the third conductive pattern layer further includes a source electrode and a drain electrode, SE and DE of FIG. 17, of a thin film transistor in the display area DA.

According to an embodiment, the third insulating layer 130 is disposed on the third conductive pattern layer.

According to an embodiment, the first layer CLK1G of the first clock signal line CLK1 is connected to the second layer CLK2D of the first clock signal line CLK1 through a contact hole that penetrates the second insulating layer 120. The second layer CLK1D of the first clock signal line CLK1 is connected to the connecting line CL1 through a contact hole that penetrates the second insulating layer 120 and the first insulating layer 110.

According to an embodiment, the first layer CLK2G of the second clock signal line CLK2 is connected to the second layer CLK2D of the second clock signal line CLK2 through a contact hole that penetrates the second insulating layer 120.

According to an embodiment, the first layer CLK3G of the third clock signal line CLK3 is connected to the second layer CLK3D of the third clock signal line CLK3 through a contact hole that penetrates the second insulating layer 120.

According to an embodiment, the first layer CLK4G of the fourth clock signal line CLK4 may be connected to the second layer CLK4D of the fourth clock signal line CLK4 through a contact hole that penetrates the second insulating layer 120.

According to an embodiment, although a connection relationship between the first clock signal line CLK1 and the first connecting line CL1 has been described in detail above, the second clock signal line CLK2 and the second connecting line CL2, the third clock signal line CLK3 and the third connecting line CL3 and the fourth clock signal line CLK4 and the fourth connecting line CL4 are similarly configured.

Figure 5:
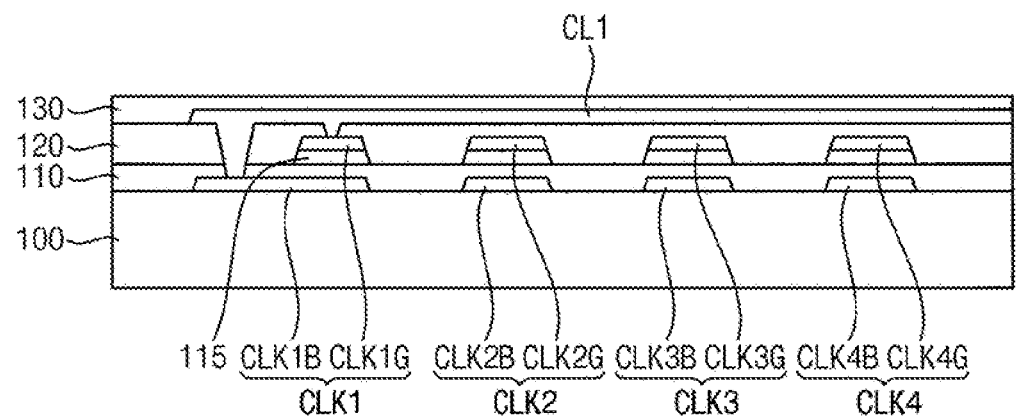
FIG. 5 is a cross-sectional view of a portion of a first wiring area of a display apparatus according to an exemplary embodiment of the inventive concept.

FIG. 5 is a cross-sectional view of a portion of a first wiring area of a display apparatus according to an exemplary embodiment of the inventive concept;

Referring to FIGS. 2 and 5, according to an embodiment, a display apparatus is substantially the same as a display apparatus of FIGS. 1 to 4, except for configurations of conductive pattern layers of the first to fourth clock signal lines CLK1, CLK2, CLK3 and CLK4, and first to fourth connecting lines CL1, CL2, CL3 and CL4. Therefore, a repeated explanation is omitted.

According to an embodiment, a display apparatus includes a base substrate 100, a first conductive pattern layer disposed on the base substrate 100, a first insulating layer 110 disposed on the first conductive pattern layer, a second conductive pattern layer disposed on the first insulating layer 110, an insulating pattern 115 disposed between the second conductive pattern layer and the first insulating layer 110, a second insulating layer 120 disposed on the second conductive pattern layer, a third conductive pattern layer disposed on the second insulating layer 120, and a third insulating layer 130 disposed on the third conductive pattern layer.

According to an embodiment, the first to fourth clock signal lines CLK1, CLK2, CLK3 and CLK4 are formed of the first conductive pattern layer and the second conductive pattern layer, and the first to fourth connecting lines CL1, CL2, CL3, and CL4 are formed of the third conductive pattern layer.

Specifically, according to an embodiment, the first conductive pattern layer includes a first layer CLK1B of the first clock signal line CLK1, a first layer CLK2B of the second clock signal line CLK2, a first layer CLK3B of the third clock signal line CLK3, and a first layer CLK4B of the fourth clock signal line CLK4. The second conductive pattern layer includes a second layer CLK1G of the first clock signal line CLK1, a second layer CLK2G of the second clock signal line CLK2 a second layer CLK3G of the third clock signal line CLK3, and a second layer CLK4G of the fourth clock signal line CLK4. The third conductive pattern layer includes the first connecting line CL1.

According to an embodiment, the first layer CLK1B of the first clock signal line CLK1 is connected to the first connecting line CL1 through a contact hole that penetrates the first insulating layer 110 and the second insulating layer 120. The second layer CLK1G of the first clock signal line CLK1 is connected to the first connecting line CL1 through a contact hole that penetrates the second insulating layer 120.

According to an embodiment, although a connection relationship between the first clock signal line CLK1 and the first connecting line CL1 has been described in detail above, the second clock signal line CLK2 and the second connecting CL2, the third clock signal line CLK3 and the third connecting line CL3, and the fourth clock signal line CLK4 and the fourth connecting line CL4 are similarly configured.

Figure 6:
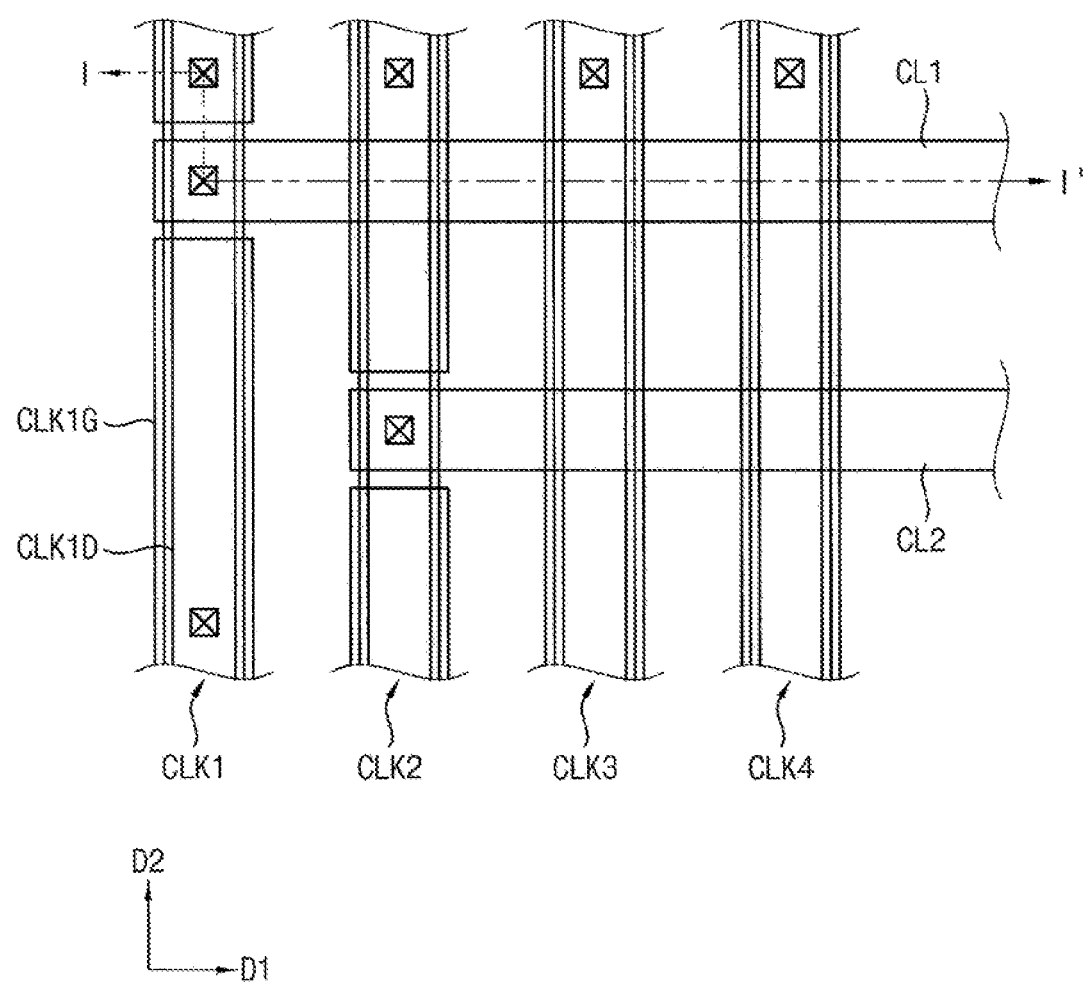
FIG. 6 is a detailed plan view of a portion of a first wiring area of a display apparatus according to an exemplary embodiment of the inventive concept.
Figure 7:
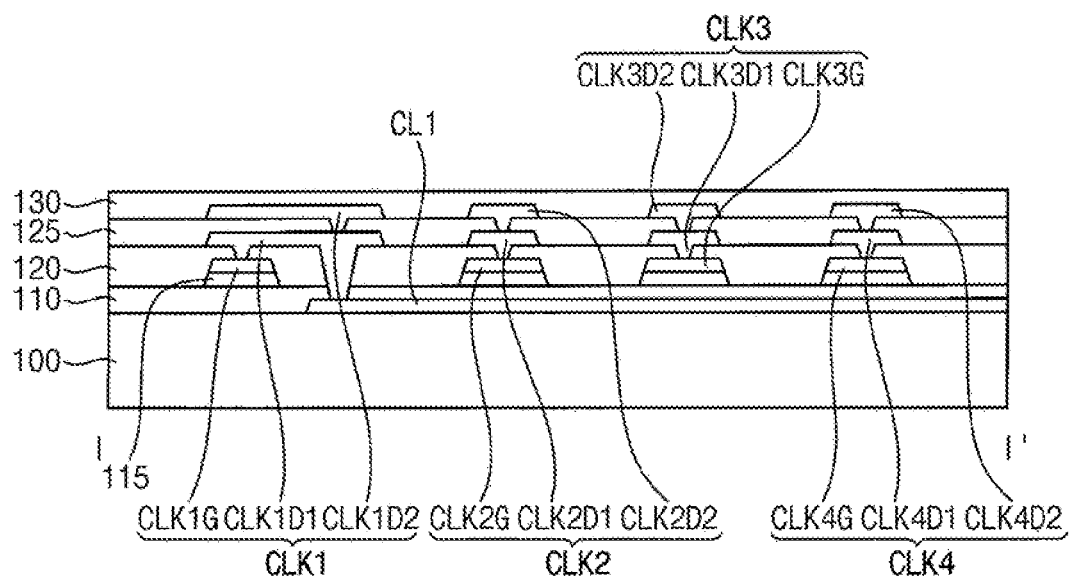
FIG. 7 is a cross-sectional view taken along a line I-I' of FIG. 6.

FIG. 6 is a detailed plan view of a portion of a first wiring area of a display apparatus according to an exemplary embodiment of the inventive concept. FIG. 7 is a cross-sectional view taken along a line I-I' of FIG. 6.

Referring to FIGS. 2, 6 and 7, according to an embodiment, a display apparatus is substantially the same as a display apparatus of FIGS. 1 to 4, except for configurations of conductive pattern layers of the first to fourth clock signal lines CLK1 to CLK4 and the first to fourth connecting lines CL1 to CL4. Thus, a repeated explanation will be omitted.

According to an embodiment, a display apparatus includes a base substrate 100, a first conductive pattern layer disposed on the base substrate 100, a first insulating layer 110 disposed on the first conductive pattern layer, a second conductive pattern layer disposed on the first insulating layer 110, an insulating pattern 115 disposed between the second conductive pattern layer and the first insulating layer 110, a second insulating layer 120 disposed on the second conductive pattern layer, a third conductive pattern layer disposed on the second insulating layer 120, an interlayer insulating layer 125 disposed on the third conductive pattern layer, a fourth conductive pattern layer disposed on the interlayer insulating layer 125 and a third insulating layer 130 disposed on the fourth conductive pattern layer.

According to an embodiment, the first to fourth clock signal lines CLK1, CLK2, CLK3 and CLK4 are formed of the second to fourth conductive pattern layers, and the first to fourth connecting lines CL1, CL2, CL3, and CL4 are formed of the first conductive pattern layer.

Specifically, according to an embodiment, the first conductive pattern layer includes the first connecting line CL1. The second conductive pattern layer includes a first layer CLK1G of the first clock signal line CLK1, a first layer CLK2G of the second clock signal line CLK2, a first layer CLK3G of the third clock signal line CLK3, and a first layer CLK4G of the fourth clock signal line CLK4. The third conductive pattern layer includes a second layer CLK1D1 of the first clock signal line CLK1, a second layer CLK2D1 of the second clock signal line CLK2, a second layer CLK3D1 of the third clock signal line CLK3, and a second layer CLK4D1 of the fourth clock signal line CLK4. The fourth conductive pattern layer includes a third layer CLK1D2 of the first clock signal line CLK1, a third layer CLK2D2 of the second clock signal line CLK2, a third layer CLK3D2 of the third clock signal line CLK3, and a third layer CLK4D2 of the fourth clock signal line CLK4.

According to an embodiment, the first connecting line CL1 is connected to the second layer CLK2D1 of the first clock signal line CLK1 through a contact hole that penetrates the first insulating layer 110 and the second insulating layer 120. The first layer CLK1G of the first clock signal line CLK1 is connected to the second layer CLK2D1 of the first clock signal line CLK1 through a contact hole that penetrates the second insulating layer 120. The second layer CLK2D1 of the first clock signal line CLK1 is connected to the third layer CLK2D2 of the first clock signal line CLK1 through a contact hole that penetrates the interlayer insulating layer 125.

According to an embodiment, the first layer CLK2G of the second clock signal line CLK2 is connected to the second layer CLK2D1 of the second clock signal line CLK2 through a contact hole that penetrates the second insulating layer 120. The second layer CLK2D1 of the second clock signal line CLK2 is connected to the third layer CLK2D2 of the second clock signal line CLK2 through a contact hole that penetrates the interlayer insulating layer 125.

According to an embodiment, the first layer CLK3G of the third clock signal line CLK3 is connected to the second layer CLK3D1 of the third clock signal line CLK3 through a contact hole that penetrates the second insulating layer 120. The second layer CLK3D1 of the third clock signal line CLK3 is connected to the third layer CLK3D2 of the third clock signal line CLK3 through a contact hole that penetrates the interlayer insulating layer 125.

According to an embodiment, the first layer CLK4G of the fourth clock signal line CLK4 is connected to the second layer CLK4D1 of the fourth clock signal line CLK4 through a contact hole that penetrates the second insulating layer 120. The second layer CLK4D1 of the fourth clock signal line CLK4 is connected to the third layer CLK4D2 of the fourth clock signal line CLK4 through a contact hole that penetrates the interlayer insulating layer 125.

According to an embodiment, although the connection relationship between the first clock signal line CLK1 and the first connecting line CL1 has been described in detail above, the second clock signal line CLK2 and the second connecting line CL2, the third clock signal line CLK3 and the third the connecting line CL3, and the fourth clock signal line CLK4 and the fourth connecting line CL4 are similarly configured.

Figure 8:
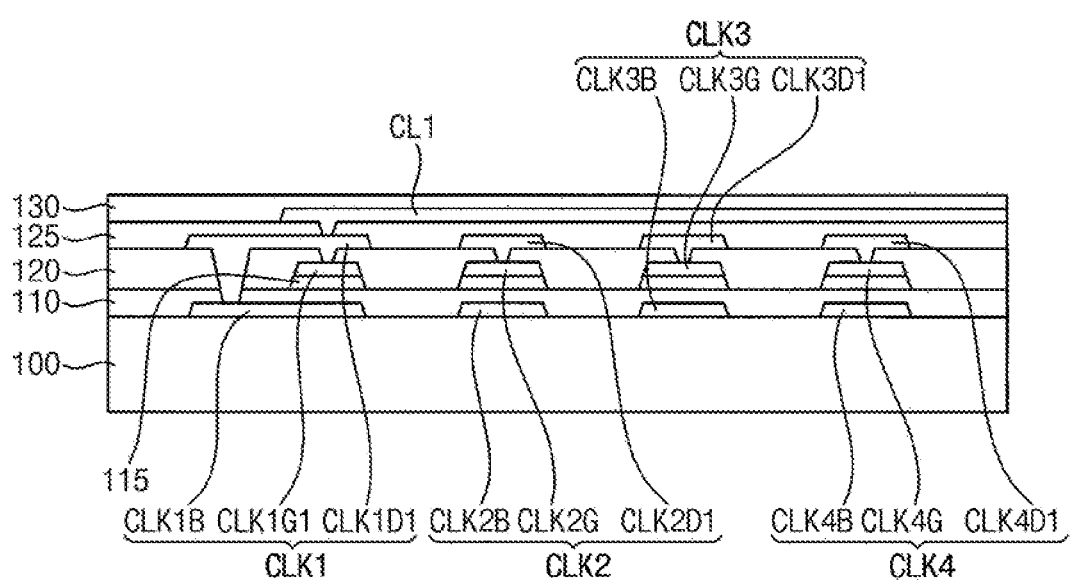
FIG. 8 is a cross-sectional view of a portion of a first wiring area of a display apparatus according to an exemplary embodiment of the inventive concept.

FIG. 8 is a cross-sectional view of a portion of a first wiring area of a display apparatus according to an exemplary embodiment of the inventive concept.

Referring to FIGS. 2 and 8, a display apparatus is substantially the same as a display apparatus of FIGS. 6 and 7, except for the configurations of conductive pattern layers of the first to fourth clock signal lines CLK1 to CLK4 and the first to fourth connecting lines CL1 to CL4. Thus, a repeated explanation will be omitted.

According to an embodiment, the first to fourth clock signal lines CLK1, CLK2, CLK3, and CLK4 are formed of a first conductive pattern layer, a second conductive pattern layer, and a third conductive pattern layer. The first to fourth connecting lines CL1, CL2, CL3, and CL4 are formed of a fourth conductive pattern layer.

Specifically, according to an embodiment, the first conductive pattern layer includes a first layer CLK1B of the first clock signal line CLK1, a first layer CLK2B of the second clock signal line CLK2, a first layer CLK3B of the third clock signal line CLK3, and a first layer CLK4B of the fourth clock signal line CLK4. The second conductive pattern layer includes a second layer CLK1G of the first clock signal line CLK1, a second layer CLK2G of the second clock signal line CLK2, a second layer CLK3G of the third clock signal line CLK3, and a second layer CLK4G of the fourth clock signal line CLK4. The third conductive pattern layer includes a third layer CLK1D1 of the first clock signal line CLK1, a third layer CLK2D1 of the second clock signal line CLK2, a third layer CLK3D1 of the third clock signal line CLK3, and a third layer CLK4D1 of the fourth clock signal line CLK4. The fourth conductive pattern layer includes the first connecting line CL1.

According to an embodiment, a connection relationship between the first clock signal line CLK1 and the first connecting line CL1 is as shown in the figure. Connection relationships between the second clock signal line CLK2 and the second connecting line CL2, between the third clock signal line CLK3 and the third connecting line CL3, and between the fourth clock signal line CLK4 and the fourth connecting line CL4 are similarly configured. A detailed description thereof will be omitted.

Figure 9:
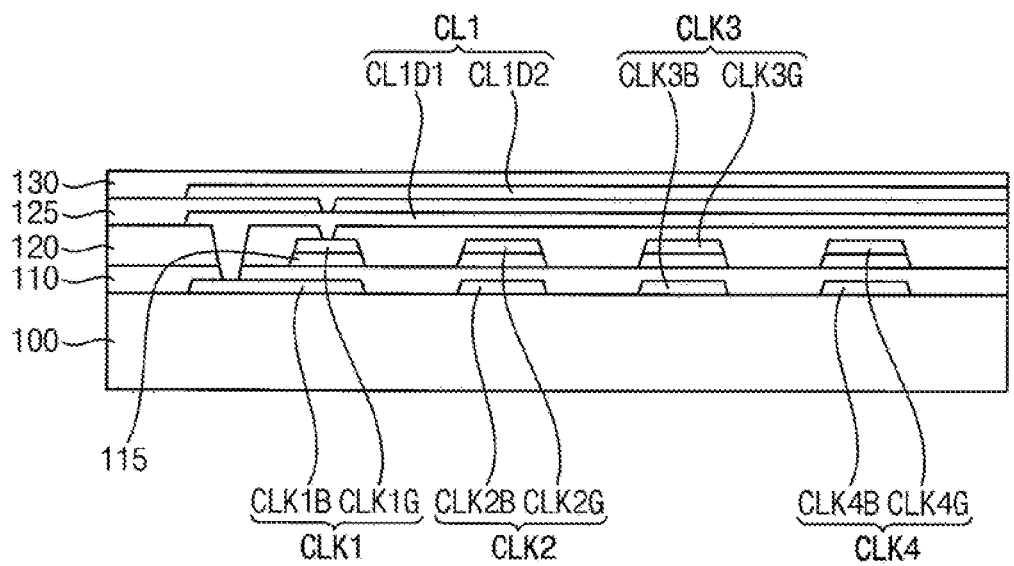
FIG. 9 is a cross-sectional view of a portion of a first wiring area of a display apparatus according to an exemplary embodiment of the inventive concept.

FIG. 9 is a cross-sectional view of a portion of a first wiring area of a display apparatus according to an exemplary embodiment of the inventive concept.

Referring to FIG. 9, According to an embodiment, a display apparatus is substantially the same as a display apparatus of FIGS. 6 and 7, except for configurations of conductive pattern layers of the first to fourth clock signal lines CLK1 to CLK4 and the first to fourth connecting lines CL1 to CL4. Thus, a repeated explanation will be omitted.

According to an embodiment, a display apparatus includes a base substrate 100, a first conductive pattern layer disposed on the base substrate 100, a first insulating layer 110 disposed on the first conductive pattern layer, a second conductive pattern layer disposed on the first insulating layer 110, an insulating pattern 115 disposed between the second conductive pattern layer and the first insulating layer 110, a second insulating layer 120 disposed on the second conductive pattern layer, a third conductive pattern layer disposed on the second insulating layer 120, an interlayer insulating layer 125 disposed on the third conductive pattern layer, a fourth conductive pattern layer disposed on the interlayer insulating layer 125, and a third insulating layer 130 disposed on the fourth conductive pattern layer.

According to an embodiment, the first to fourth clock signal lines CLK1, CLK2, CLK3 and CLK4 are formed of the first and second conductive pattern layers, and the first to fourth connecting lines CL1 and CL2, CL3 and CL4 are formed of the third and fourth conductive pattern layers. That is, each of the first to fourth clock signal lines CLK1, CLK2, CLK3, CLK4 and the first to fourth connection lines CL1, CL2, CL3 and CL4 has a double layer structure.

Specifically, according to an embodiment, the first conductive pattern layer includes a first layer CLK1B of the first clock signal line CLK1, a first layer CLK2B of the second clock signal line CLK2, a first layer CLK3B of the third clock signal line CLK3, and a first layer CLK4B of the fourth clock signal line CLK4. The second conductive pattern layer includes a second layer CLK1G of the first clock signal line CLK1, a second layer CLK2G of the second clock signal line CLK2, a second layer CLK3G of the third clock signal line CLK3, and a second layer CLK4G of the fourth clock signal line CLK4.

According to an embodiment, the third conductive pattern layer includes a first layer CL1D1 of the first connecting line CL1. The fourth conductive pattern layer includes a second layer CL1D2 of the first connecting line CL1.

According to an embodiment, the first layer CL1D1 of the first connecting line CL1 is connected to the first layer CLK1B of the first clock signal line CLK1 through a contact hole that penetrates the second insulating layer 120 and the first insulating layer 110. The first layer CLD1D1 of the first connecting line CL1 is connected to the second layer CLK1G of the first clock signal line CLK1 through a contact hole that penetrates the second insulating layer 120.

According to an embodiment, the second layer CL1D2 of the first connecting line CL1 is connected to the first layer CL1D1 of the first connecting line CL1 through a contact hole that penetrates the interlayer insulating layer 125.

According to an embodiment, although the connection relationship between the first clock signal line CLK1 and the first connecting line CL1 has been described in detail above, the second clock signal line CLK2 and the second connecting line CL2, the third clock signal line CLK3 and the third connecting line CL3, and the fourth clock signal line CLK4 and the fourth connecting line CL4 are similarly configured.

Figure 10:
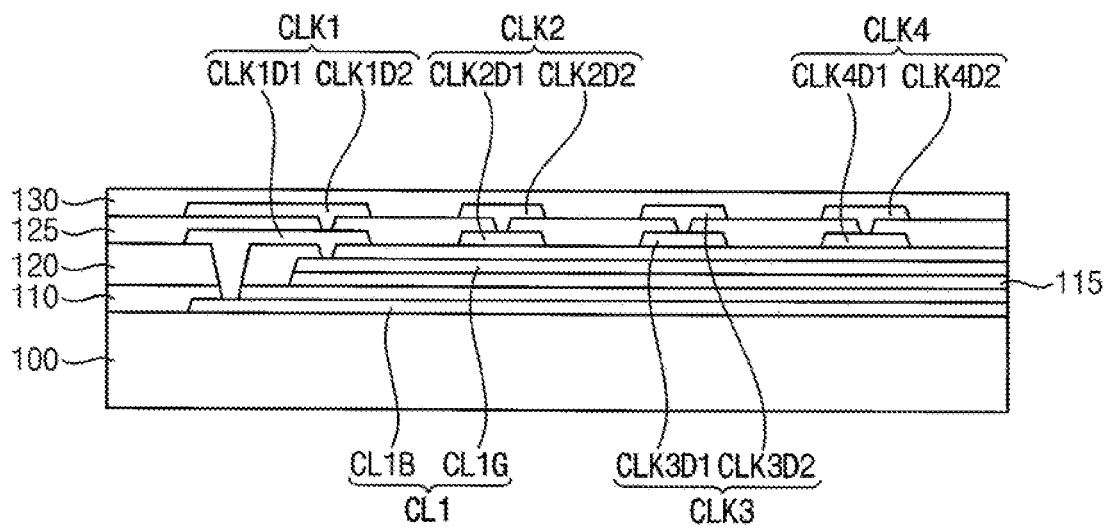
FIG. 10 is a cross-sectional view of a portion of a first wiring area of a display apparatus according to an exemplary embodiment of the inventive concept.

FIG. 10 is a cross-sectional view of a portion of a first wiring area of a display apparatus according to an exemplary embodiment of the inventive concept.

Referring to FIG. 10, according to an embodiment, a display apparatus is substantially the same as a display apparatus of FIG. 9, except that first to fourth clock signal lines CLK1, CLK2, CLK3, and CLK4 are formed of a third conductive pattern layer and a fourth conductive pattern layer, and first through fourth connecting lines CL1, CL2, CL3 and CL4 are formed of a first conductive pattern layer and a second conductive pattern layer. Thus, a repeated explanation will be omitted.

According to an embodiment, a display apparatus includes a base substrate 100, a first conductive pattern layer disposed on the base substrate 100, a first insulating layer 110 disposed on the first conductive pattern layer, a second conductive pattern layer disposed on the first insulating layer 110, an insulating pattern 115 disposed between the second conductive pattern layer and the first insulating layer 110, a second insulating layer 120 disposed on the second conductive pattern layer, a third conductive pattern layer disposed on the second insulating layer 120, an interlayer insulating layer 125 disposed on the third conductive pattern layer, a fourth conductive pattern layer disposed on the interlayer insulating layer 125, and a third insulating layer 130 disposed on the fourth conductive pattern layer.

According to an embodiment, the first to fourth clock signal lines CLK1, CLK2, CLK3 and CLK4 are formed of the third and fourth conductive pattern layers, and the first to fourth connecting lines CL1 and CL2, CL3 and CL4 are formed of the first and second conductive pattern layers. That is, each of the first to fourth clock signal lines CLK1, CLK2, CLK3, CLK4 and the first to fourth connection lines CL1, CL2, CL3 and CL4 has a double layer structure.

Specifically, according to an embodiment, the first conductive pattern layer includes a first layer CL1B of the first connecting line CL1. The fourth conductive pattern layer includes a second layer CL1G of the first connecting line CL1.

According to an embodiment, the third conductive pattern layer includes a first layer CLK1D1 of the first clock signal line CLK1, a first layer CLK2D1 of the second clock signal line CLK2, a first layer CLK3D1 of the third clock signal line CLK3, and a first layer CLK4D1 of the fourth clock signal line CLK4. The fourth conductive pattern layer includes a second layer CLK1D2 of the first clock signal line CLK1, a second layer CLK2D2 of the second clock signal line CLK2, a second layer CLK3D2 of the third clock signal line CLK3, and a second layer CLK4D2 of the fourth clock signal line CLK4.

According to an embodiment, the first layer CL1B of the first connecting line CL1 is connected to the first layer CLK1D1 of the first clock signal line CLK1 through a contact hole that penetrates the second insulating layer 120 and the first insulating layer 110. The second layer CLD1G of the first connecting line CL1 is connected to the first layer CLK1D1 of the first clock signal line CLK1 through a contact hole formed that penetrates the second insulating layer 120.

According to an embodiment, the second layer CL1D2 of the first clock signal line CLK1 is connected to the first layer CL1D1 of the first clock signal line CLK1 through a contact hole that penetrates the interlayer insulating layer 125.

According to an embodiment, although the connection relationship between the first clock signal line CLK1 and the first connecting line CL1 has been described in detail above, the second clock signal line CLK2 and the second connecting line CL2, the third clock signal line CLK3 and the third the connecting line CL3, and the fourth clock signal line CLK4 and the fourth connecting line CL4 are similarly configured.

Figure 11:
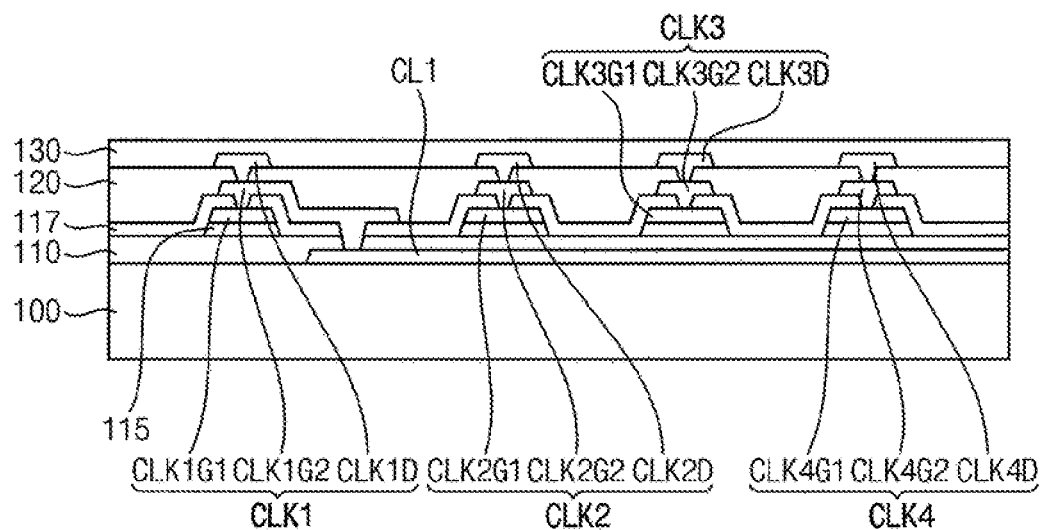
FIG. 11 is a cross-sectional view of a portion of a first wiring area of a display apparatus according to an exemplary embodiment of the inventive concept.

FIG. 11 is a cross-sectional view of a portion of a first wiring area of a display apparatus according to an exemplary embodiment of the inventive concept.

Referring to FIG. 11, according to an embodiment, a display apparatus is substantially the same as a display apparatus of FIG. 7, except that a third conductive pattern layer is disposed between a gate insulating layer 117 and a second insulating layer 120. Therefore, a repeated explanation will be omitted.

According to an embodiment, a display apparatus includes a base substrate 100, a first conductive pattern layer disposed on the base substrate 100, a first insulating layer 110 disposed on the first conductive pattern layer, a second conductive pattern layer disposed on the first insulating layer 110, an insulating pattern 115 disposed between the second conductive pattern layer and the first insulating layer 110, a gate insulating layer 117 disposed on the second conductive pattern layer, a third conductive pattern layer disposed on the gate insulating layer 117, a second insulating layer 120 disposed on the third conductive pattern, a fourth conductive pattern layer disposed on the second insulating layer 120, and a third insulating layer 130 disposed on the fourth conductive pattern layer.

According to an embodiment, the first to fourth clock signal lines CLK1, CLK2, CL3 and CLK4 are formed of the second to fourth conductive pattern layers, and the first to fourth connecting lines CL1 and CL2, CL3 and CL4 are formed of the first conductive pattern layer.

Specifically, according to an embodiment, the first conductive pattern includes the first connecting line CL1. The second conductive pattern layer includes a first layer CLK1G1 of the first clock signal line CLK1, a first layer CLK2G1 of the second clock signal line CLK2, a first layer CLK3G1 of the third clock signal line CLK3, and a first layer CLK4G1 of the fourth clock signal line CLK4. The third conductive pattern layer includes a second layer CLK1G2 of the first clock signal line CLK1, a second layer CLK2G2 of the second clock signal line CLK2, a second layer CLK3G2 of the third clock signal line CLK3, and a second layer CLK4G2 of the fourth clock signal line CLK4. The fourth conductive pattern layer includes a third layer CLK1D of the first clock signal line CLK1, a third layer CLK2D of the second clock signal line CLK2, a third layer CLK3D of the third clock signal line CLK3, and a third layer CLK4D of the fourth clock signal line CLK4.

According to an embodiment, the first connecting line CL1 is connected to the second layer CLK1G2 of the first clock signal line CLK1 through a contact hole that penetrates the gate insulating layer 117 and the first insulating layer 110. The second layer CLD1G2 of the first clock signal line CLK1 is connected to the third layer CLK1D of the first clock signal line CLK1 through a contact hole formed that penetrates the second insulating layer 120.

According to an embodiment, a connection relationship between the first clock signal line CLK1 and the first connecting line CL1 is as shown in the figure and described above. Connection relationships between the second clock signal line CLK2 and the second connecting line CL2, between the third clock signal line CLK3 and the third connecting line CL3 and between the fourth clock signal line CLK4 and the fourth connecting line CL4 are similarly configured. A detailed description thereof will be omitted.

Figure 12:
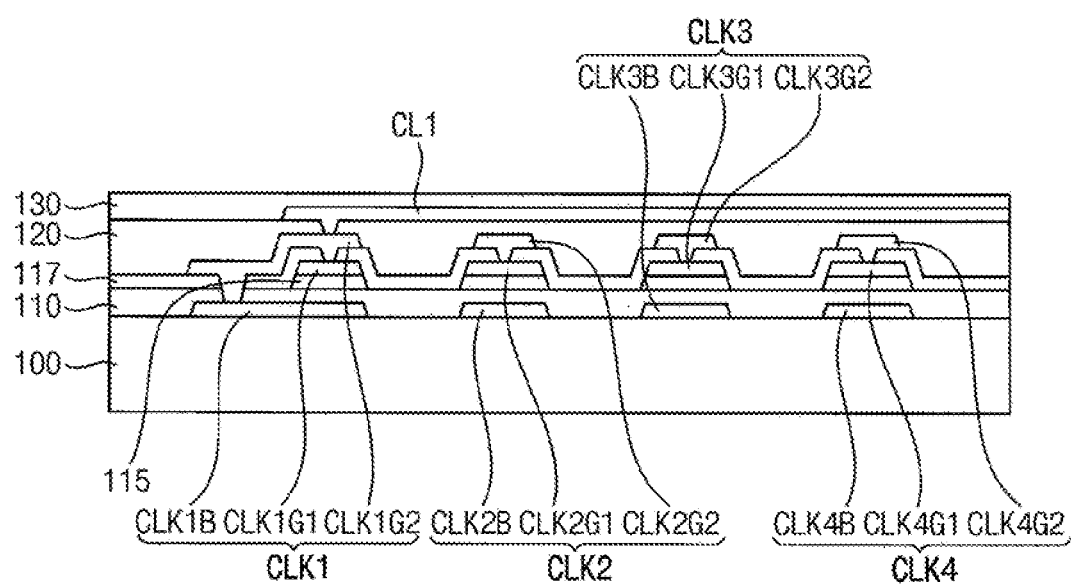
FIG. 12 is a cross-sectional view of a portion of a first wiring area of a display apparatus according to an exemplary embodiment of the inventive concept.

FIG. 12 is a cross-sectional view of a portion of a first wiring area of a display apparatus according to an exemplary embodiment of the inventive concept.

Referring to FIG. 12, according to an embodiment, a display apparatus may be substantially the same as the display apparatus of FIG. 11, except for configurations of conductive pattern layers constituting first to fourth clock signal lines CLK1 to CLK4 and the first to fourth connecting lines CL1 to CL4. Thus, a repeated explanation will be omitted.

The first to fourth clock signal lines CLK1, CLK2, CLK3, and CLK4 are formed of a first conductive pattern layer, a second conductive pattern layer, and a third conductive pattern layer. The connection wirings CL1, CL2, CL3, and CL4 may be formed of a fourth conductive pattern layer.

Specifically, according to an embodiment, the first conductive pattern layer includes a first layer CLK1B of the first clock signal line CLK1, a first layer CLK2B of the second clock signal line CLK2, a first layer CLK3B of the third clock signal line CLK3, and a first layer CLK4B of the fourth clock signal line CLK4. The second conductive pattern layer includes a second layer CLK1G1 of the first clock signal line CLK1, a second layer CLK2G1 of the second clock signal line CLK2, a second layer CLK3G1 of the third clock signal line CLK3, and a second layer CLK4G1 of the fourth clock signal line CLK4. The third conductive pattern layer includes a third layer CLK1G2 of the first clock signal line CLK1, a third layer CLK2G2 of the second clock signal line CLK2, a third layer CLK3G2 of the third clock signal line CLK3, and a third layer CLK4G2 of the fourth clock signal line CLK4. The fourth conductive pattern includes the first connecting line CL1.

According to an embodiment, the first connecting line CL1 is connected to the third layer CLK1G2 of the first clock signal line CLK1 through a contact hole that penetrates the second insulating layer 120. The third layer CLD1G2 of the first clock signal line CLK1 is connected to the second layer CLK1G1 of the first clock signal line CLK1 through a contact hole formed that penetrates the gate insulating layer 117, and the third layer CLD1G2 of the first clock signal line CLK1 is connected to the first layer CLK1B of the first clock signal line CLK1 through a contact hole formed that penetrates the gate insulating layer 117 and the first insulating layer 110.

According to an embodiment, a connection relationship between the first clock signal line CLK1 and the first connecting line CL1 is as shown in the figure and described above. The second clock signal line CLK2 and the second connecting line CL2, the third clock signal line CLK3, and the third the connecting line CL3 and the fourth clock signal line CLK4 and the fourth connecting line CL4 may be similarly configured. A detailed description thereof will be omitted.

Figure 13:
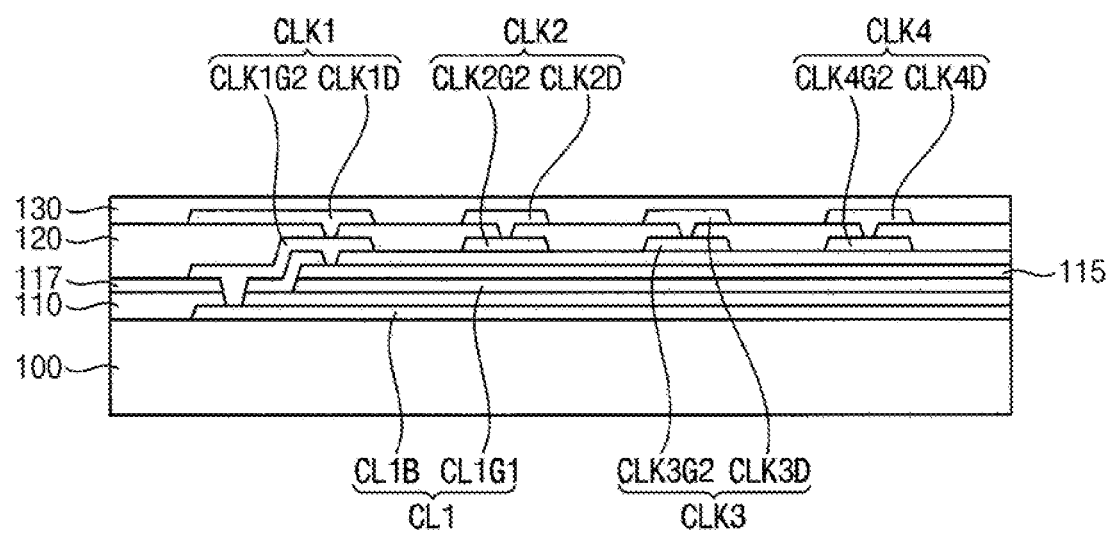
FIG. 13 is a cross-sectional view of a portion of a first wiring area of a display apparatus according to an exemplary embodiment of the inventive concept.

FIG. 13 is a cross-sectional view of a portion of a first wiring area of a display apparatus according to an exemplary embodiment of the inventive concept.

Referring to FIG. 13, according to an embodiment, a display apparatus is substantially the same as a display apparatus of FIG. 12, except for configurations of conductive pattern layers constituting first to fourth clock signal lines CLK1 to CLK4 and the first to fourth connecting lines CL1 to CL4. Thus, a repeated explanation will be omitted.

According to an embodiment, first to fourth clock signal lines CLK1, CLK2, CLK3 and CLK4 include the first and second conductive pattern layers, and the first to fourth connecting lines CL1 and CL2, CL3 and CL4 include the third and fourth conductive pattern layers. That is, each of the first to fourth clock signal lines CLK1, CLK2, CLK3 and CLK4 and the first to fourth connecting lines CL1, CL2, CL3 and CL4 has a double layer structure.

Specifically, according to an embodiment, the first conductive pattern layer includes a first layer CL1B of the first connecting line CL1. The second conductive pattern layer includes a second layer CL1G1 of the first connecting line CL1.

According to an embodiment, the third conductive pattern layer includes a first layer CLK1G2 of the first clock signal line CLK1 a first layer CLK2G2 of the second clock signal line CLK2, a first layer CLK3G2 of the third clock signal line CLK3, and a first layer CLK4G2 of the fourth clock signal line CLK4. The fourth conductive pattern layer includes a second layer CLK1D of the first clock signal line CLK1, a second layer CLK2D of the second clock signal line CLK2, a second layer CLK3D of the third clock signal line CLK3, and a second layer CLK4D of the fourth clock signal CLK4.

According to an embodiment, the first layer CL1B of the first connecting line CL1 is connected to the first layer CLK1G2 of the first clock signal line CLK1 through a contact hole that penetrates the gate insulating layer 117 and the first insulating layer 110.

According to an embodiment, the second layer CLK1D of the first clock signal line CLK1 is connected to the first layer CLK1G2 of the first clock signal line CLK1 through a contact hole that penetrates the second insulating layer 120.

According to an embodiment, a connection relationship between the first clock signal line CLK1 and the first connecting line CL1 is as shown in the figure and as described above. The second clock signal line CLK2 and the second connecting line CL2, the third clock signal line CLK3, and the third the connecting line CL3 and the fourth clock signal line CLK4 and the fourth connecting line CL4 are similarly configured. A detailed description thereof will be omitted.

Figure 14:
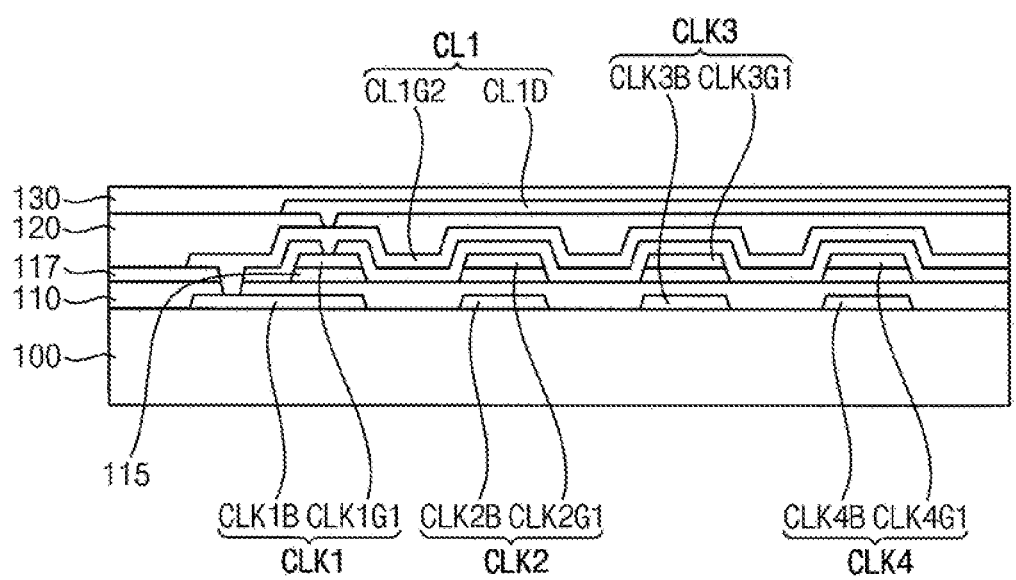
FIG. 14 is a cross-sectional view of a portion of a first wiring area of a display apparatus according to an exemplary embodiment of the inventive concept.

FIG. 14 is a cross-sectional view of a portion of a first wiring area of a display apparatus according to an exemplary embodiment of the inventive concept.

Referring to FIG. 14, according to an embodiment, a display apparatus is substantially the same as a display apparatus of FIG. 13, except that first to fourth clock signal lines CLK1, CLK2, CLK3 and CLK4 are formed of first and second conductive pattern layers, and the first to fourth connecting lines CL1, CL2, CL3 and CL4 are formed of third and fourth conductive pattern layers. Thus, a repeated explanation will be omitted.

Specifically, according to an embodiment, the third conductive pattern layer includes a first layer CL1G2 of the first connecting line CL1. The fourth conductive pattern layer includes a second layer CL1D of the first connecting line CL1.

According to an embodiment, the first conductive pattern layer includes a first layer CLK1B of the first clock signal line CLK1, a first layer CLK2B of the second clock signal line CLK2, a first layer CLK3B of the third clock signal line CLK3, and a first layer CLK4B of the fourth clock signal line CLK4. The second conductive pattern layer includes a second layer CLK1G1 of the first clock signal line CLK1, a second layer CLK2G1 of the second clock signal line CLK2, a second layer CLK3G1 of the third clock signal line CLK3, and a second layer CLK4G1 of the fourth clock signal line CLK4.

According to an embodiment, the first layer CL1G2 of the first connecting line CL1 is connected to the second layer CLK1G1 of the first clock signal line CLK1 through a contact hole that penetrates the gate insulating layer 117, and is connected to the first layer CLK1B of the first clock signal line CLK1 through a contact hole that penetrates the gate insulating layer 117 and the first insulating layer 110. The second layer CL1D of the first connecting line CL1 is connected to the first layer CL1G2 of the first connecting line CL1 through a contact hole that penetrates the second insulating layer 120.

According to an embodiment, a connection relationship between the first clock signal line CLK1 and the first connecting line CL1 is as shown in the figure and as described above. The second clock signal line CLK2 and the second connecting line CL2, the third clock signal line CLK3, and the third the connecting line CL3 and the fourth clock signal line CLK4 and the fourth connecting line CL4 are similarly configured. A detailed description thereof will be omitted.

Figure 15:
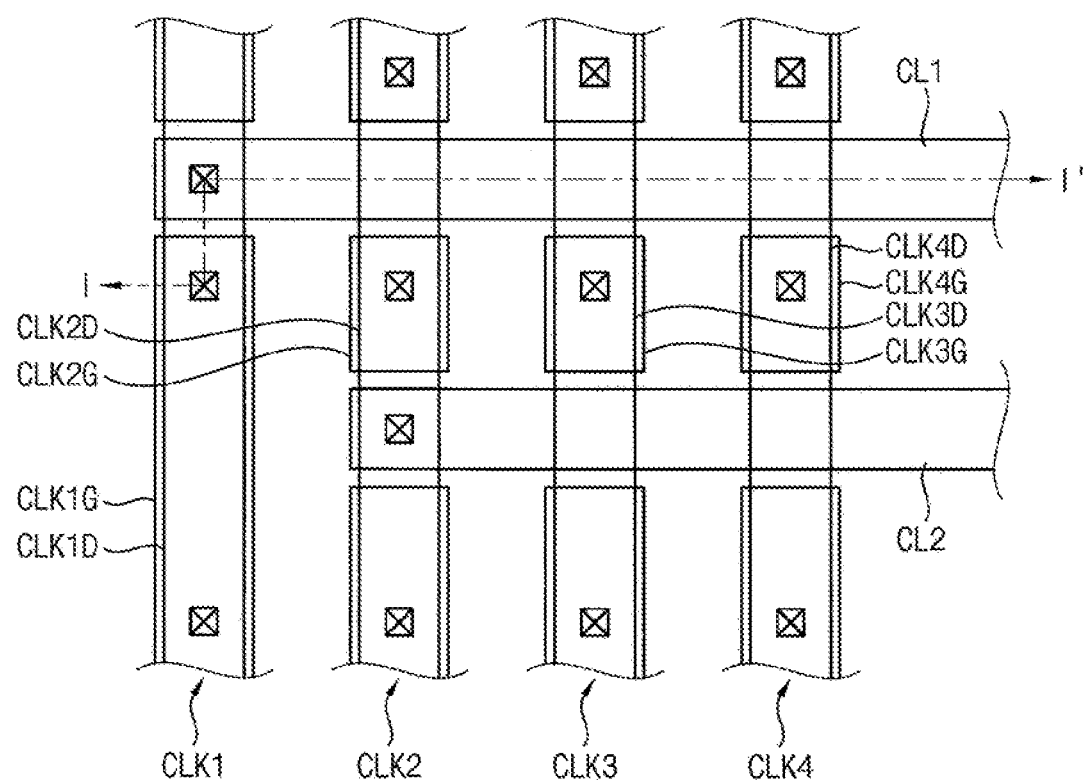
FIG. 15 is a cross-sectional view of a portion of a first wiring area of a display apparatus according to an exemplary embodiment of the inventive concept.
Figure 16:
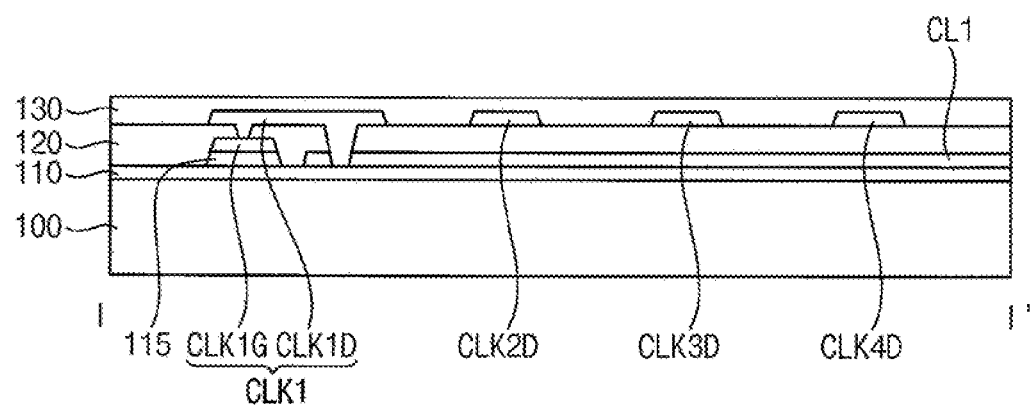
FIG. 16 is a cross-sectional view taken along a line I-I' of FIG. 15.

FIG. 15 is a cross-sectional view of a portion of a first wiring area of a display apparatus according to an exemplary embodiment of the inventive concept. FIG. 16 is a cross-sectional view taken along a line I-I' of FIG. 15.

Referring to FIGS. 15 and 16, according to an embodiment, a display apparatus includes a base substrate 100, an active pattern layer disposed on the first insulating layer 110, a first conductive pattern layer disposed on the active pattern layer, an insulating pattern 115 disposed between the first conductive pattern layer and the first insulating layer 110, a second insulating layer 120 disposed on the first conductive pattern layer, a second conductive pattern layer disposed on the second insulating layer 120, and a third insulating layer 130 disposed on the second conductive pattern layer.

According to an embodiment, the active pattern layer includes an active pattern, ACT in FIG. 17, of a thin film transistor in a display area DA of FIG. 1 and the connecting line CL1. Since the connecting line CL1 is used as an electrical wiring, the connecting line CL1 has a portion doped with impurities and improved conductivity.

At this time, according to an embodiment, for doping the impurity, the connecting line CL1 does not overlap the first conductive pattern layer. Therefore, in a plan view, in a portion where the first connecting line CL1 is located, the wiring may be broken (cut) so that the first conductive pattern layer is not formed, as shown in FIG. 15

According to an embodiment, the first conductive pattern layer includes a first layer CLK1G of a first clock signal line CLK1, a first layer CLK2G of a second clock signal line CLK2, a first layer CLK3G of a third clock signal line CLK3, and a first layer CLK4G of the fourth clock signal line CLK4.

According to an embodiment, the second conductive pattern layer includes a second layer CLK1D of the first clock signal line CLK1, a second layer CLK2D of the second clock signal line CLK2, a second layer CLK2D of the third clock signal line CLK3, and a second layer CLK2D of the fourth clock signal line CLK4.

According to an embodiment, the connecting line CL1 is connected to the second layer CLK1D of the first clock signal line CLK1 through a contact hole that penetrates the second insulation layer 120. The second layer CLK1D of the first clock signal line CLK1 is connected to the first layer of the first clock signal line CLK1 through a contact hole that penetrates the second insulating layer 120.

According to an embodiment, although the connection relationship between the first clock signal line CLK1 and the first connecting line CL1 has been described in detail above, the second clock signal line CLK2 and the second connecting line CL2, the third clock signal line CLK3 and the third the connecting line CL3, and the fourth clock signal line CLK4 and the fourth connecting line CL4 are similarly configured.

FIG. 17 is a cross-sectional view of a stacked pixel structure in a display area of a display apparatus according to an exemplary embodiment of the inventive concept.

Referring to FIG. 17, according to an embodiment, in a display area DA of FIG. 1, a display apparatus may include a base substrate 100, a lower conductive pattern BML, a first insulating layer 110, an active pattern ACT, a gate electrode GE, an insulating pattern 115, a second insulating layer 120, a source electrode SE and a drain electrode DE, a third insulating layer 130, a pixel defining layer PDL, a light emitting structure 180, and a thin film encapsulation layer TFE.

According to an embodiment, the base substrate 100 may be made of a transparent or opaque material.

According to an embodiment, the lower conductive pattern BML is disposed on the base substrate 100. The lower conductive pattern BML is formed of a first conductive pattern layer.

According to an embodiment, the first insulating layer 110 is disposed on the base substrate 100 on which the lower conductive pattern BML is disposed.

According to an embodiment, the active pattern ACT is disposed on the first insulating layer 110 and overlaps the bottom conductive pattern BML. The active pattern ACT may include amorphous silicon or poly crystal silicon. The active pattern ACT includes a drain region and a source region doped with an impurity and a channel region between the drain region and the source region.

According to an embodiment, the gate electrode GE is disposed on a channel region of the active pattern ACT. The gate electrode GE is formed of a second conductive pattern layer.

According to an embodiment, the insulating pattern 115 is disposed between the gate electrode GE and the first insulating layer 110.

According to an embodiment, the second insulating layer 120 is disposed on the first insulating layer 110 on which the gate electrode GE is disposed.

According to an embodiment, the source electrode SE and the drain electrode DE are disposed on the second insulating layer 120. The source electrode SE and the drain electrode DE are electrically connected to the active pattern ACT through contact holes that penetrate the second insulating layer 120. The drain electrode DE is electrically connected to the lower conductive pattern BML through a contact hole that penetrates the first and second insulating layers 110 and 120. The source electrode SE and the drain electrode DE are formed of a third conductive pattern layer.

According to an embodiment, the third insulating layer 130 is disposed on the source electrode SE and the drain electrode DE. The third insulating layer 130 is a via insulating layer. The via insulating layer may be formed as a single layer structure or in a multi-layer structure that includes at least two insulating layers. The via insulating layer may be formed using an organic material such as a photoresist, an acrylic resin, a polyimide resin, a polyamide resin, or a siloxane-based resin.

According to an embodiment, the light emitting structure 180 includes a first electrode 181, a light emitting layer 182, and a second electrode 183.

According to an embodiment, the first electrode 181 is disposed on the third insulating layer 130. The first electrode 181 may include a reflective material or a transmissive material in accordance with the emission type of the display apparatus. In exemplary embodiments, the first electrode 181 may have a single layer structure or a multi layer structure, which can include a metal film, an alloy film, a metal nitride film, a conductive metal oxide film, or a transparent conductive film.

According to an embodiment, the pixel defining layer PDL is disposed on the third insulating layer 130 on which the first electrode 181 is disposed. The pixel defining layer PDL is formed using an organic material. For example, the pixel defining layer PDL may include photoresist, an acryl-based resin, a polyimide-based resin, a polyimide-based resin, a siloxane-based resin, etc. In some exemplary embodiments, an opening which exposes the first electrode 181 is formed by etching the pixel defining layer PDL. An emitting area and a non-emitting area of the display apparatus are defined by the opening of the pixel defining layer PDL. For example, a portion where the opening of the pixel defining layer PDL is located corresponds to an emitting area, and a non-emitting area corresponds to a portion adjacent to the opening of the pixel defining layer PDL.

According to an embodiment, the light emitting layer 182 is disposed on the first electrode 181 exposed through the opening of the pixel defining layer PDL. In addition, the light emitting layer 182 extends on a sidewall of the opening of the pixel defining layer PDL. In some exemplary embodiments, the light emitting layer 182 includes an organic light emitting layer (EL), a hole injection layer (HIL), a hole transfer layer (HTL), an electron transfer layer (ETL), an electron injection layer (EIL), etc. In some exemplary embodiments, except for the organic emission layer, the hole injection layer, the hole transport layer, the electron transport layer, and the electron injection layer are formed in common to correspond to a plurality of pixels. In some exemplary embodiments, a plurality of organic light emitting layers are formed using light emitting materials that generate different colors of light, such as red light, green light or blue light, in accordance with color pixels of the display device. In some exemplary embodiments, the organic light emitting layer of the of the light emitting layer 18 includes a plurality of stacked light emitting materials that generate red light, green light or blue light to thereby emit white light. Here, elements of the light emitting layer 182 are commonly formed so as to correspond to a plurality of pixels, and each pixel can be divided by a color filter layer.

According to an embodiment, the second electrode 183 is disposed on the pixel defining layer PDL and the light emitting layer 182. The second electrode 183 may include a transmissive material or a reflective material in accordance with the emission type of the display device. In exemplary embodiments, the second electrode 183 may also have a single layer structure or a multi layer structure, which can include a metal film, an alloy film, a metal nitride film, a conductive metal oxide film or a transparent conductive film.

According to an embodiment, the thin film encapsulation layer TFE is disposed on the second electrode 183. The thin film encapsulation layer TFE prevents penetration of external moisture and oxygen. The thin film encapsulation layer TFE includes at least one organic layer and at least one inorganic layer. The at least one organic layer and the at least one inorganic layer are alternately stacked with each other. For example, the thin film encapsulation layer TFE may include two inorganic layers and one organic layer therebetween, but embodiments are not limited thereto. In some embodiments, a sealing substrate is provided that shields outside air and moisture from penetrating into the display apparatus, instead of the thin film encapsulation layer TFE.

FIG. 18 is a cross-sectional view of a portion of a second wiring area LA2 of a display apparatus according to an exemplary embodiment of the inventive concept.

Referring to FIGS. 2 and 18, according to an embodiment, in the second wiring area LA2, a display apparatus includes a first conductive pattern layer, a first insulating layer 110, a second conductive pattern layer, an insulating pattern 115, a second insulating layer 120, a third conductive pattern layer, an interlayer insulating layer 125, a fourth conductive pattern layer and a third insulating layer 130.

According to an embodiment, the first conductive pattern layer includes a gate connecting line SL. The second conductive pattern layer includes a first layer VSS1G of a first power supply line VSS1, a first layer VSS2G of a second power supply line VSS2, a first layer VSS3G of a third power supply line VSS3. The third conductive pattern layer includes a second layer VSS1D1 of the first power supply line VSS1, a second layer VSS2D1 of the second power supply line VSS2, a second layer VSS3D1 of the third power supply line VSS3. The first layer VSS1G of the first power source line VSS1 is connected to the second layer VSS1D1 of the first power source line VSS1 through a contact hole formed through the second insulating layer 120.

That is, according to an embodiment, the first power supply line VSS1, the second power supply line VSS2, and the third power supply line VSS3 have a double layer structure of the second conductive pattern layer and the third conductive pattern layer.

According to an embodiment, the fourth conductive pattern layer includes an ELVSS lines (ELVSS). The ELVSS line ELVSS is electrically connected to a second electrode 183 in FIG. 17 of a light emitting structure in a display area. The ELVSS line ELVSS overlaps the first to third power supply lines VSS1, VSS2 and VSS3 to reduce a width of the second wiring area LA2.

According to an embodiment, the first to third power supply lines VSS1, VSS2 and VSS3 are electrically connected to the gate signal generator ASG by the first to third power supply connecting lines CL5, CL6 and CL7. These have a structure similar to a connecting structure of the connecting lines and the clock signal lines described above. Therefore a detailed description thereof will be omitted.

Figure 19:
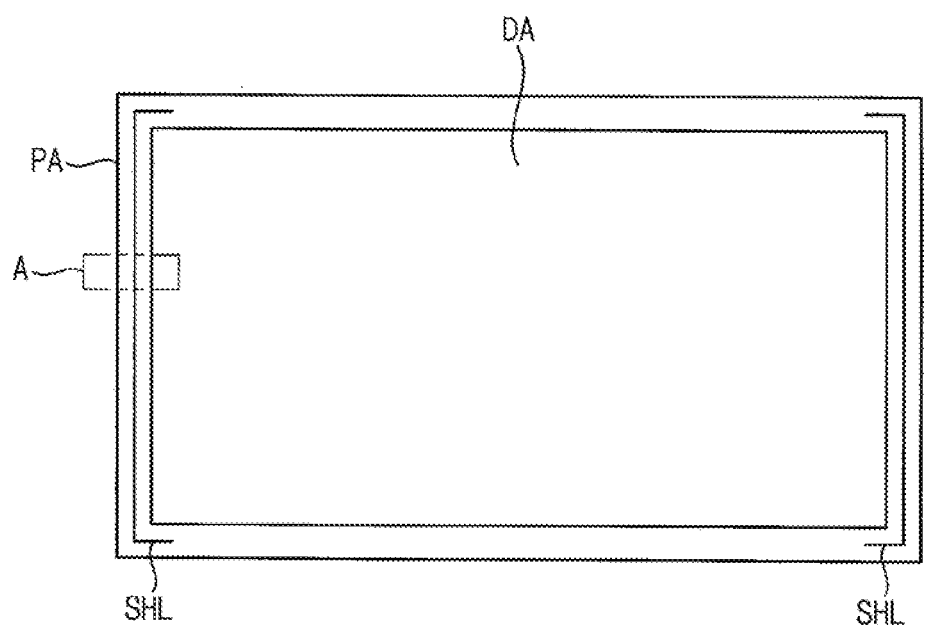
FIG. 19 is a plan view of a display apparatus according to an exemplary embodiment of the inventive concept.
Figure 19:
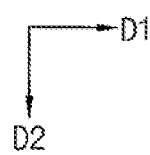
Figure 20:
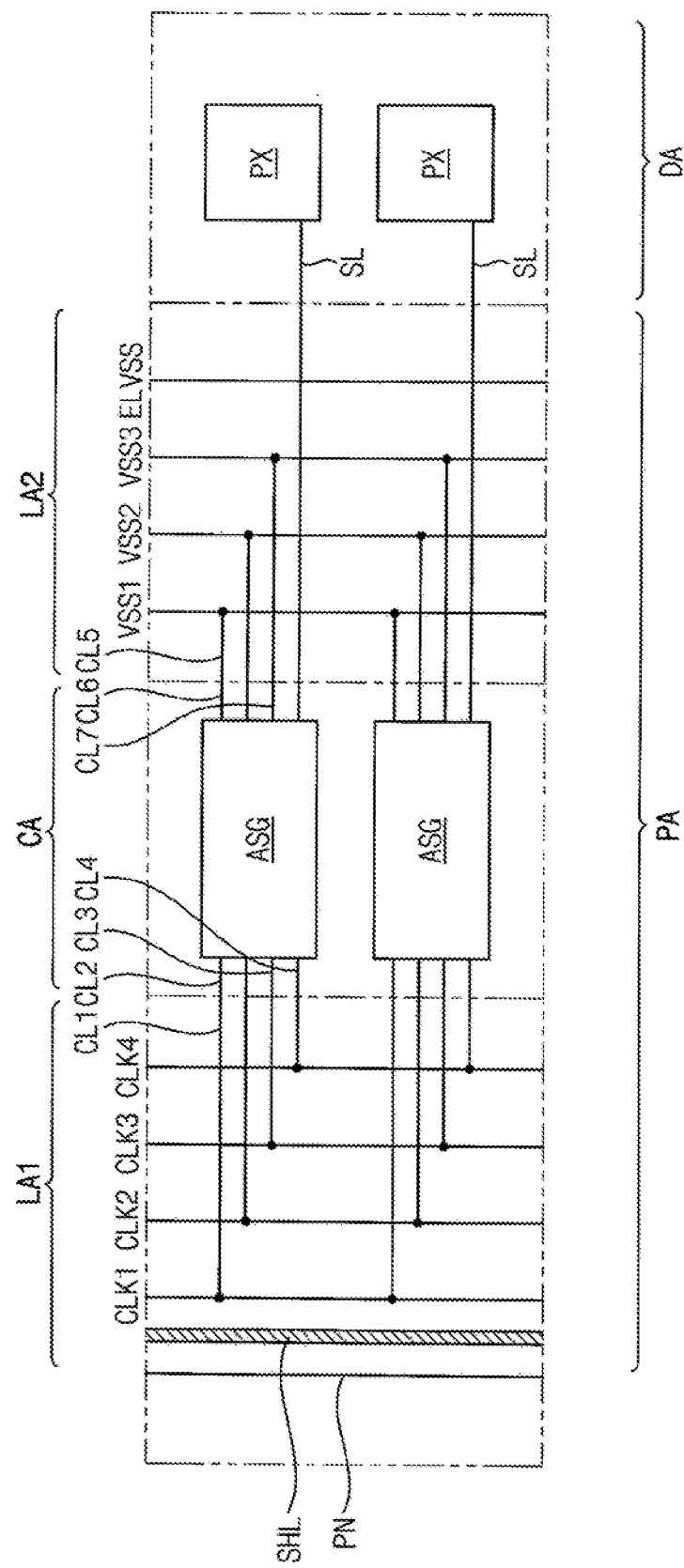
FIG. 20 illustrates circuits and wirings in an area A of a display apparatus of FIG. 19.

FIG. 19 is a plan view of a display apparatus according to an exemplary embodiment of the inventive concept. FIG. 20 illustrates circuits and wirings in an area A of a display apparatus of FIG. 19.

Referring to FIGS. 19 and 20, according to an embodiment, a display apparatus is substantially the same as a display apparatus of FIGS. 1 to 4, except that it further includes a shield wiring SHL disposed at the outermost portion of a peripheral area PA. Therefore, a repeated explanation will be omitted.

According to an embodiment, a display apparatus further includes the shield wiring SHL disposed in the peripheral area PA. That is, the shield line SHL is disposed adjacent to first to fourth signal clock signal lines CLK1 to CLK4, and is disposed between the first to fourth signal clock signal lines CLK1 to CLK4 and an end of the base substrate PN. The shield wiring SHL is formed of any one of the first to third conductive pattern layers or a plurality of layers or more, and may be in a floating state or a constant voltage state, such as the ELVSS voltage. The shield wiring SHL can prevent static electricity from flowing at the outermost portions of the clock signal lines, and thus the display quality can be improved.

Figure 21:
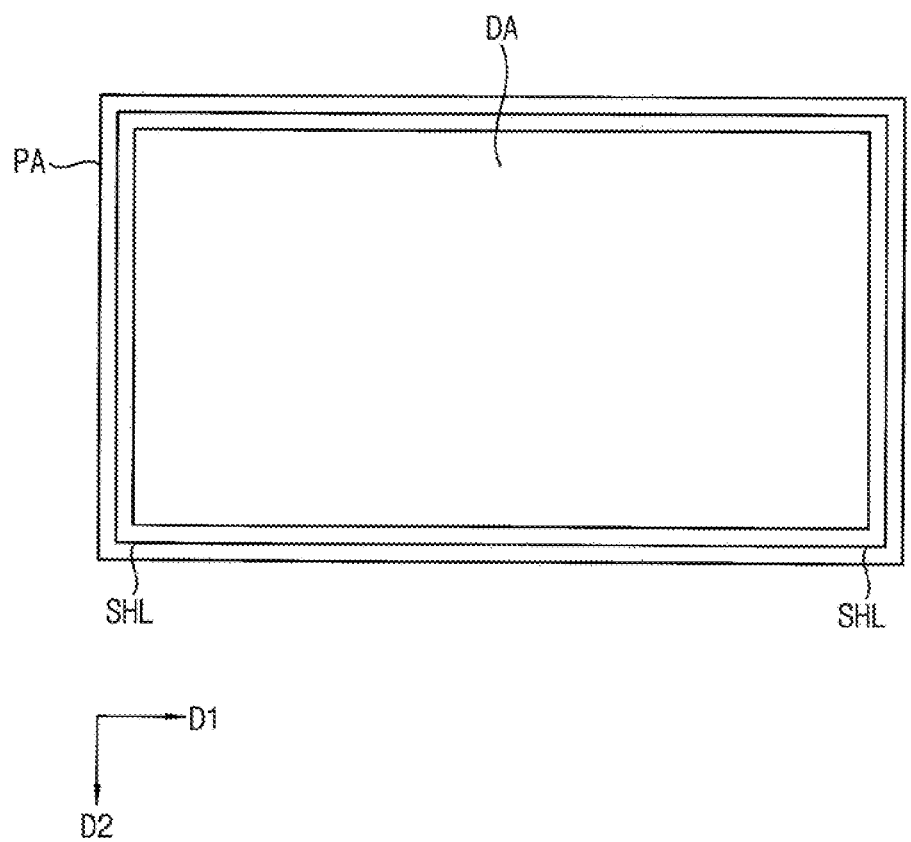
FIG. 21 is a plan view of a display apparatus according to an exemplary embodiment of the inventive concept.

FIG. 21 is a plan view of a display apparatus according to an exemplary embodiment of the inventive concept.

Referring to FIG. 21, according to an embodiment, a display apparatus is substantially the same as a display apparatus of FIGS. 19 and 20 except that a shield wiring SHL completely surrounds a display area PA. Therefore, a repeated explanation is omitted.

According to embodiments of the present inventive concept, clock signal lines are formed of a plurality of conductive pattern layers, and the connecting lines which connect the clock signal lines to the gate signal generator are formed as an uppermost layer or a lowermost layer of the conductive pattern layer. A resistance of the clock signal lines is reduced and a parasitic capacitance between the clock signal lines and the connecting lines can be minimized.

Figure 22:
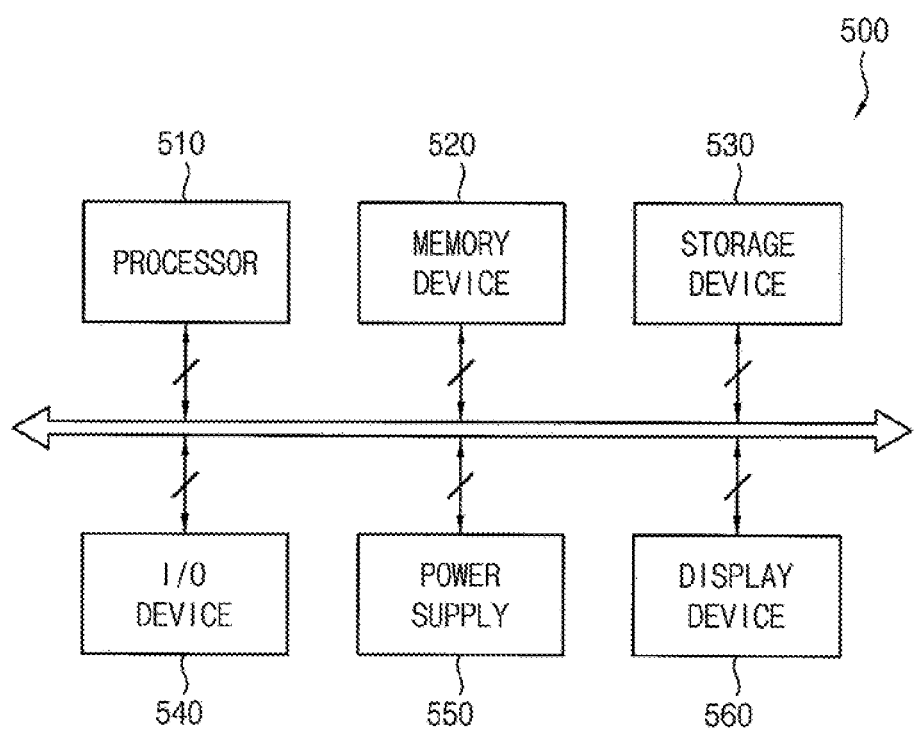
FIG. 22 is a block diagram of an electronic device according to exemplary embodiments.
Figure 23A:
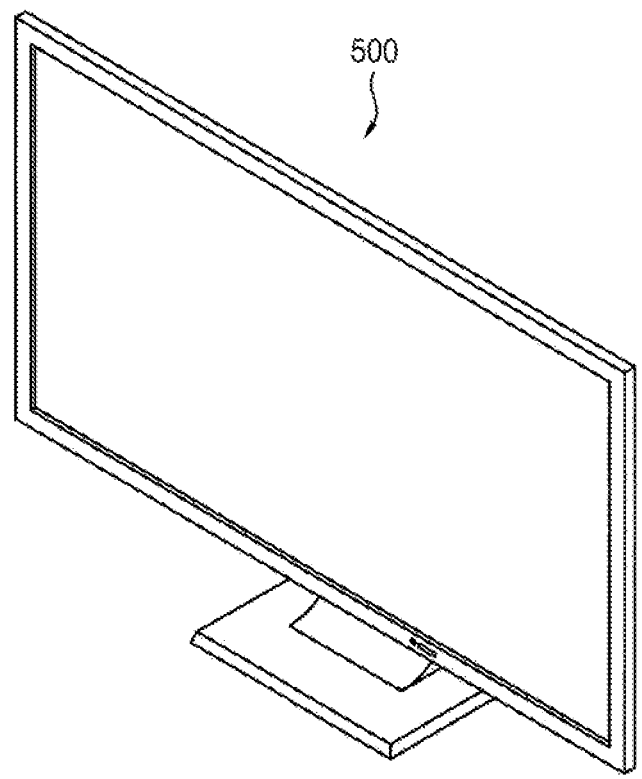
FIG. 23A illustrates an example in which an electronic device of FIG. 22 is implemented as a television.
Figure 23B:
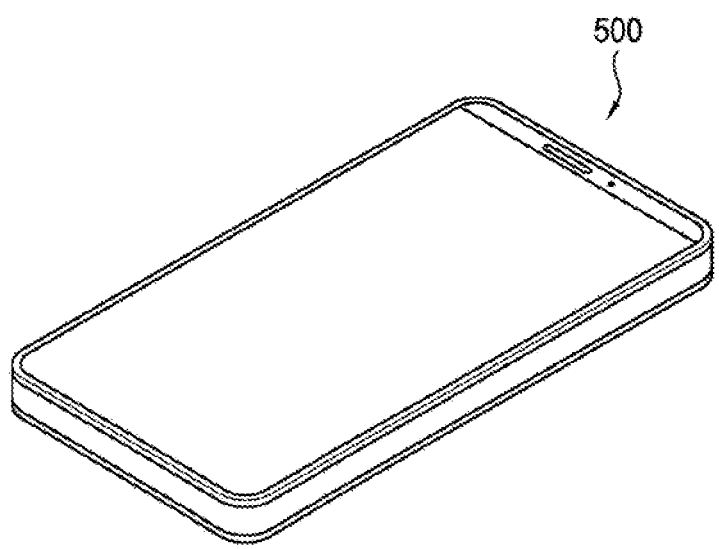
FIG. 23B illustrates an example in which an electronic device of FIG. 22 is implemented as a smart phone.

FIG. 22 is a block diagram of an electronic device according to exemplary embodiments. FIG. 23A illustrates an example in which an electronic device of FIG. 22 is implemented as a television. FIG. 23B illustrates an example in which an electronic device of FIG. 22 is implemented as a smart phone.

Referring to FIGS. 22 through 23B, according to an embodiment, the electronic device 500 includes a processor 510, a memory device 520, a storage device 530, an input/output (I/O) device 540, a power supply 550, and a display device 560. Here, the display device 560 corresponds to a display apparatus of FIG. 1. In addition, the electronic device 500 further includes a plurality of ports for communicating with a video card, a sound card, a memory card, a universal serial bus (USB) device, other electronic devices, etc. In an exemplary embodiment, as illustrated in FIG. 23A, the electronic device 500 is implemented as a television. In another exemplary embodiment, as illustrated in FIG. 23B, the electronic device 500 is implemented as a smart phone. However, embodiments of the electronic device 500 are not limited thereto. For example, the electronic device 500 can be implemented as a cellular phone, a video phone, a smart pad, a smart watch, a tablet PC, a car navigation system, a computer monitor, a laptop, a head mounted display (HMD), etc.

According to an embodiment, the processor 510 performs various computing functions. The processor 510 may be a micro processor, a central processing unit (CPU), an application processor (AP), etc. The processor 510 is coupled to other components via an address bus, a control bus, a data bus, etc. Further, the processor 510 can be coupled to an extended bus such as a peripheral component interconnection (PCI) bus. The memory device 520 stores data for operating the electronic device 500. For example, the memory device 520 includes at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, or at least one volatile memory device such as a dynamic random access memory (DRAM) device, a static random access memory (SRAM) device, a mobile DRAM device, etc. The storage device 530 may be a solid state drive (SSD) device, a hard disk drive (HDD) device, a CD-ROM device, etc. The I/O device 540 includes an input device such as a keyboard, a keypad, a mouse device, a touchpad, a touch-screen, etc., and an output device such as a printer, a speaker, etc. The power supply 550 provides power for operating the electronic device 500.

According to an embodiment, the display device 560 can be coupled to other components via the buses or other communication links. In some exemplary embodiments, the display device 560 is included in the I/O device 540. As described above, since the clock signal lines of the display apparatus 560 are formed of a plurality of conductive pattern layers and the connecting lines that connect the clock signal lines and the gate signal generator are formed as the uppermost layer or the lowermost layer of the conductive pattern layer, resistance of the clock signal lines decreases and parasitic capacitance between the clock signal line and the connecting line can be minimized.

Embodiments of present inventive concept can be incorporated into organic light emitting display devices and various electronic devices including the same. For example, embodiments of the present inventive concept can be incorporated into a mobile phone, a smart phone, a video phone, a smart pad, a smart watch, a tablet PC, a car navigation system, a television, a computer monitor, a notebook, etc.

The foregoing is illustrative of embodiments of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. Therefore, it is to be understood that the foregoing is illustrative of embodiments of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A display apparatus, comprising:
a base substrate that includes a display area in which pixels are formed and a peripheral area that is a non-display area that surrounds the display area, wherein the peripheral area includes a first wiring area and a circuit area;
a first conductive pattern layer disposed on the base substrate;
a first insulating layer disposed on the first conductive pattern layer;
a second conductive pattern layer disposed on the first insulating layer;
a second insulating layer disposed on the second conductive pattern layer;
a third conductive pattern layer disposed on the second insulating layer,
a plurality of signal lines disposed in the first wiring area, wherein the plurality of signal lines are spaced apart in a first direction and extends in a second direction substantially perpendicular to the first direction;
a gate signal generator disposed in the circuit area, wherein the gate signal generator generates a gate signal and transmits the gate signal to the pixels; and
a plurality of connecting lines disposed in the peripheral area, wherein the plurality of connecting lines extends in the first direction and respectively connects the signal lines to the gate signal generator,
wherein the connecting lines are formed of a lowermost layer or an uppermost layer of the conductive pattern layers, and
the signal lines are formed of at least two layers of conductive pattern layers that overlap each other.

2. The display apparatus of claim 1, further comprising a thin film transistor disposed in the display area,
wherein the thin film transistor comprises:
a lower conductive pattern disposed on the base substrate;
an active pattern that overlaps the lower conductive pattern;
a gate electrode disposed on the active pattern; and
source and drain electrodes electrically connected to the active pattern,
wherein the lower conductive pattern and the connecting lines are formed of the first conductive pattern layer,
the gate electrode is formed of the second conductive pattern layer,
the source and drain electrodes are formed of the third conductive pattern layer, and
each of the signal lines is formed of the second conductive pattern layer and the third conductive pattern layer.

3. The display apparatus of claim 1, further comprising:
a lower conductive pattern disposed in the display area of the base substrate; and
a thin film transistor disposed in the display area and that overlaps the lower conductive pattern,
wherein the thin film transistor comprises:
an active pattern that overlaps the lower conductive pattern;

a gate electrode disposed on the active pattern; and source and drain electrodes electrically connected to the active pattern, wherein the lower conductive pattern is formed of the first conductive pattern layer, the gate electrode is formed of the second conductive pattern layer, the source and drain electrodes and the connecting lines are formed of the third conductive pattern layer, and each of the signal lines are formed of the first and second conductive pattern layers.

4. The display apparatus of claim 1, further comprising:

a third insulating layer disposed on the third conductive pattern layer; and a fourth conductive pattern layer disposed on the third insulating layer.

5. The display apparatus of claim 4, wherein the signal lines are formed of the first, second and third conductive pattern layers, and the connecting lines are formed of the fourth conductive pattern layer.

6. The display apparatus of claim 4, wherein the signal lines are formed of the second, third and fourth conductive layers, and the connecting lines are formed of the first conductive pattern layer.

7. The display apparatus of claim 6, further comprising an insulating pattern having the same planar shape as the second conductive pattern layer disposed between the first insulating layer and the second conductive pattern layer, wherein a portion of the third conductive pattern layer is electrically connected to a portion of the first conductive pattern layer through a contact hole that penetrates the second and first insulating layers, a portion of the fourth conductive pattern layer is electrically connected to a portion of the third conductive pattern layer through a contact hole that penetrates the third insulating layer.

8. The display apparatus of claim 4, wherein the signal lines are formed of the first and second conductive pattern layers, and the connecting lines include two layers formed of the third and fourth conductive pattern layers that overlap each other.

9. The display apparatus of claim 4, wherein the signal lines are formed of the third and fourth conductive pattern layers, and the connecting lines include two layers formed of the first and second conductive pattern layers that overlap each other.

10. The display apparatus of claim 1, further comprising an insulating pattern having the same planar shape as the second conductive pattern layer disposed between the first insulating layer and the second conductive pattern layer, wherein a portion of the third conductive pattern layer is electrically connected to a portion of the first conductive pattern layer through a contact hole that penetrates the second and first insulating layers.

11. The display apparatus of claim 1, wherein the peripheral area further includes a second wiring area disposed between the circuit area and the display area, wherein the display apparatus further comprises a plurality of power supply lines disposed in the second wiring area, wherein the plurality of power supply lines are spaced apart in the first direction and extend in the second direction, and a plurality of power supply connecting lines disposed in the peripheral area, wherein the plurality of power supply connecting lines connect the power supply lines to the gate signal generator and extend in the first direction, wherein the power supply connecting lines are formed of the lowermost layer or the uppermost layer of the conductive pattern layers, and the power supply lines are formed of at least two or more layers of the conductive pattern layers.

12. The display apparatus of claim 11, further comprising:

a third insulation layer disposed on the third conductive pattern layer; and a fourth conductive pattern layer disposed on the third insulation layer, wherein the power supply connecting lines are formed of the first conductive pattern layer or the fourth conductive pattern layer, and each of the power supply lines is formed of either the second to fourth conductive pattern layers or the first to third conductive pattern layers.

13. The display apparatus of claim 11, further comprising:

a via insulating layer disposed on the second insulating layer;

a first electrode disposed on the via insulating layer in the display area;

a light emitting layer disposed on the first electrode;

a second electrode disposed on the light emitting layer; and an ELVSS line in the second wiring area that overlaps at least two of the power supply lines, wherein the ELVSS line is electrically connected to the second electrode.

14. The display apparatus of claim 1, further comprising:

a shield wiring disposed on the base substrate adjacent to the signal lines, wherein the shield wiring is formed of one or more of the first to third conductive pattern layers, and the signal lines are disposed between the shield wiring and the gate signal generator.

15. The display apparatus of claim 1, further comprising:

a gate connecting line that connects the gate signal generator and the pixel, wherein the gate connecting line is formed of a lowermost layer or an uppermost layer of the conductive pattern layers.

16. The display apparatus of claim 1, wherein the signal lines comprises a first portion and a second portion that overlaps the first portion, and the first portion and the second portion are connected through a contact hole that penetrates an insulation layer between the first portion and the second portion.

* * * * *